United States Patent
Liao et al.

(10) Patent No.: US 9,690,971 B2
(45) Date of Patent: Jun. 27, 2017

(54) PHOTO-SENSING UNIT, PHOTO-SENSING APPARATUS, AND METHOD FOR FABRICATING PHOTO-SENSING UNIT

(71) Applicant: AU Optronics Corporation, Hsin-Chu (TW)

(72) Inventors: Yi-Huan Liao, Hsin-Chu (TW); Chih-Hao Lin, Hsin-Chu (TW); Jhen-Yu You, Hsin-Chu (TW); Jhen-Fu Cho, Hsin-Chu (TW); Chun Chang, Hsin-Chu (TW); An-Thung Cho, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/230,983

(22) Filed: Aug. 8, 2016

(65) Prior Publication Data
US 2017/0124373 A1      May 4, 2017

(30) Foreign Application Priority Data

Oct. 29, 2015   (TW) .............................. 104135521 A

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *G06K 9/00* | (2006.01) |
| *H01L 31/032* | (2006.01) |
| *H01L 31/109* | (2006.01) |

(Continued)

(52) U.S. Cl.
CPC ...... *G06K 9/0004* (2013.01); *H01L 27/14609* (2013.01); *H01L 27/14612* (2013.01); *H01L 27/14623* (2013.01); *H01L 27/14636* (2013.01); *H01L 27/14683* (2013.01); *H01L 31/032* (2013.01); *H01L 31/109* (2013.01); *H01L 31/165* (2013.01); *H01L 31/18* (2013.01)

(58) Field of Classification Search
USPC ..... 257/57, 59, 83, 257, 290, 351, 368, 392; 438/30, 48, 128, 149, 151, 157, 161, 283
See application file for complete search history.

(56) References Cited

U.S. PATENT DOCUMENTS

| | | |
|---|---|---|
| 8,796,626 B2 | 8/2014 | Han et al. |
| 2006/0237809 A1 | 10/2006 | Bhattacharyya |

(Continued)

*Primary Examiner* — Tram H Nguyen
(74) *Attorney, Agent, or Firm* — WPAT, PC; Justin King

(57) ABSTRACT

A photo-sensing unit including a first electrode, a first insulation layer, a photo-sensing structure and a second electrode is provided. The first insulation layer covers the first electrode and has an opening exposing the first electrode. The photo-sensing structure is located on the first electrode and disposed in the opening of the first insulation layer. The photo-sensing structure includes a first photo-sensing layer and a second photo-sensing layer stacked with each other. A material of the first photo-sensing layer is $Si_xGe_yO_z$. A material of the second photo-sensing layer is $Si_vO_w$. The second electrode covers the photo-sensing structure. A photo-sensing apparatus including the photo-sensing unit and a fabricating method of a photo-sensing unit are also provided.

16 Claims, 22 Drawing Sheets

(51) Int. Cl.
*H01L 27/146* (2006.01)
*H01L 31/16* (2006.01)
*H01L 31/18* (2006.01)

(56) References Cited

U.S. PATENT DOCUMENTS

2011/0101338 A1* 5/2011 Yamazaki ........... H01L 27/1225
257/43
2012/0268427 A1* 10/2012 Slobodin ................ G06F 3/042
345/175

* cited by examiner

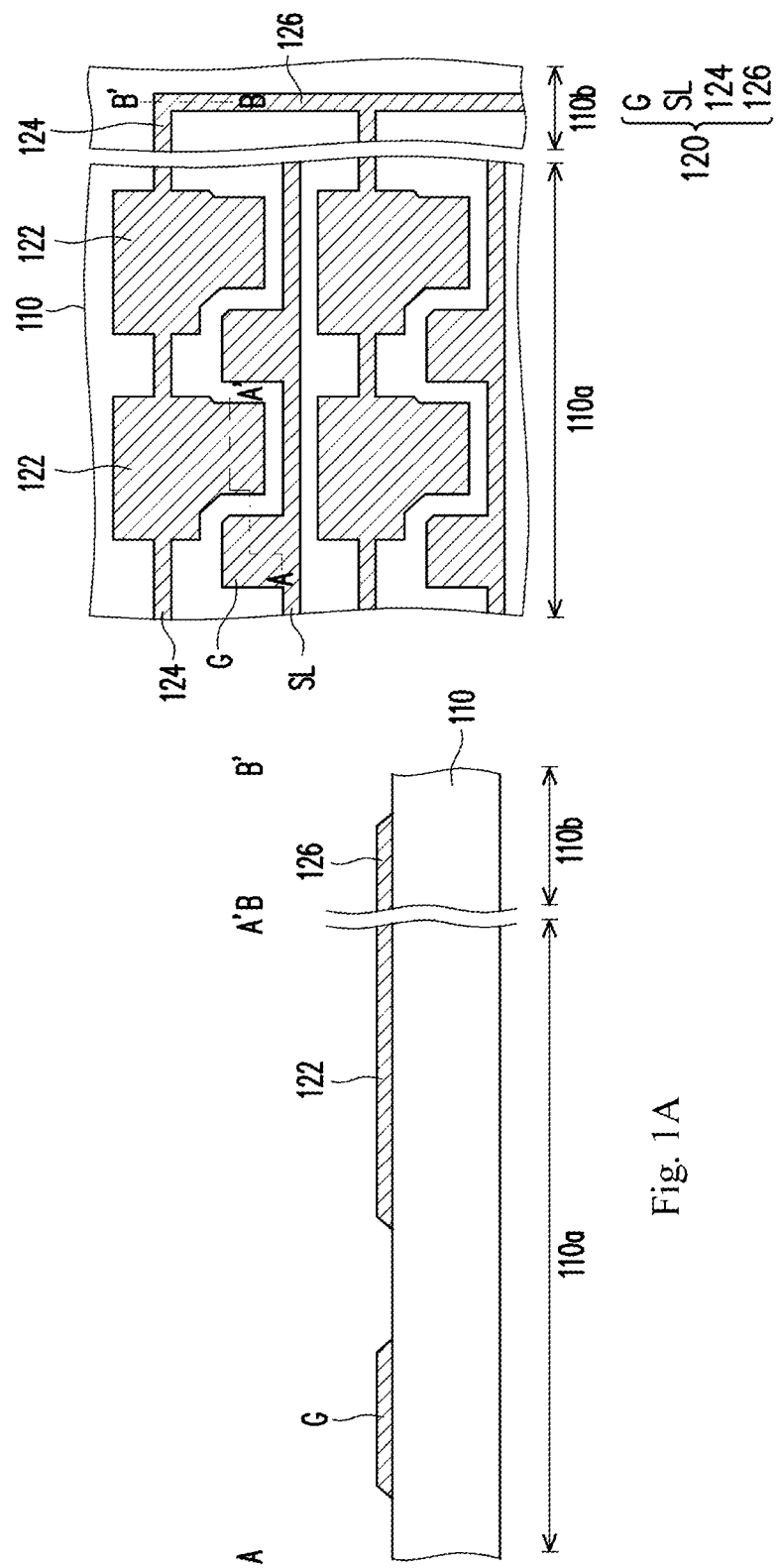

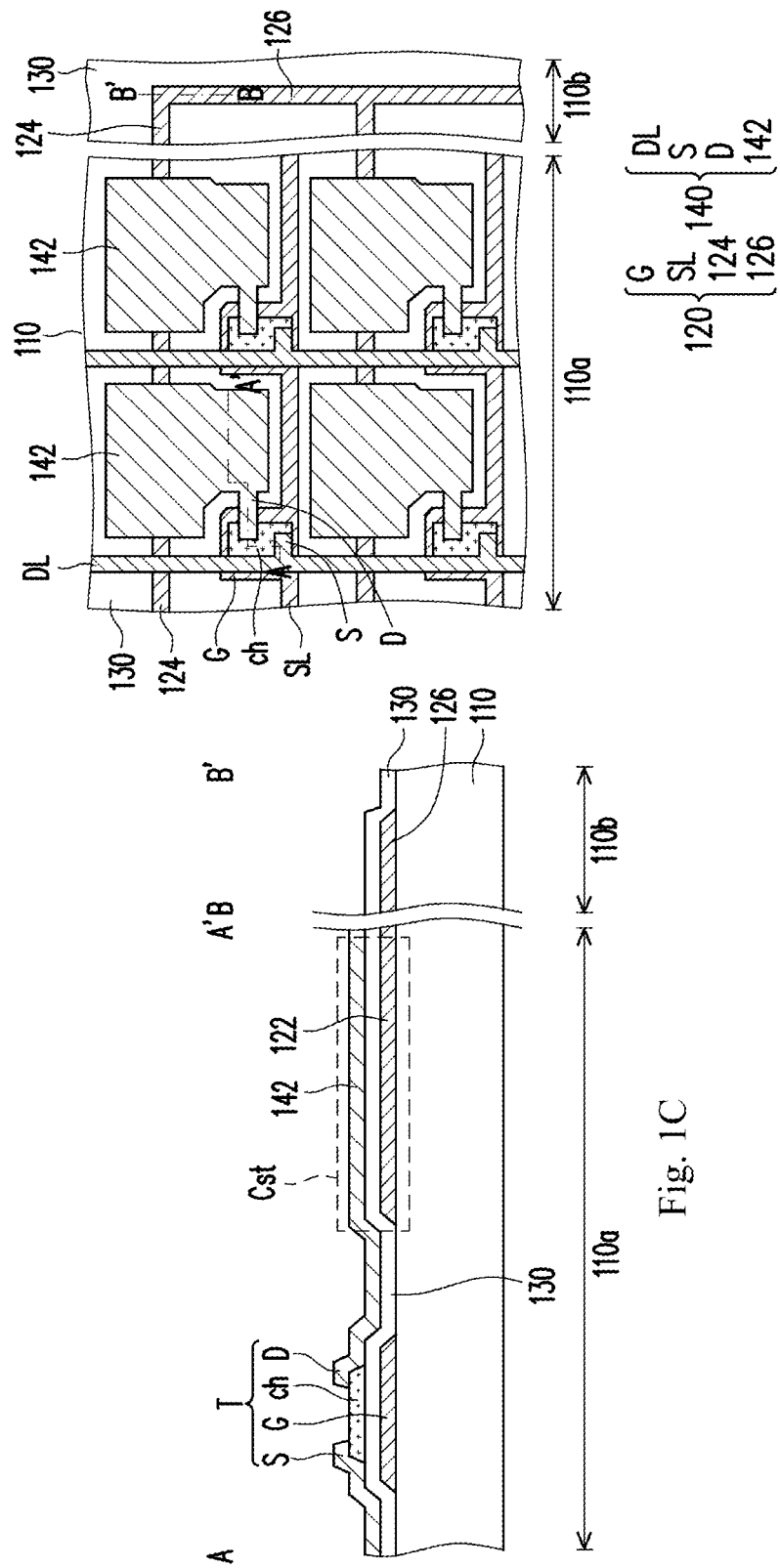

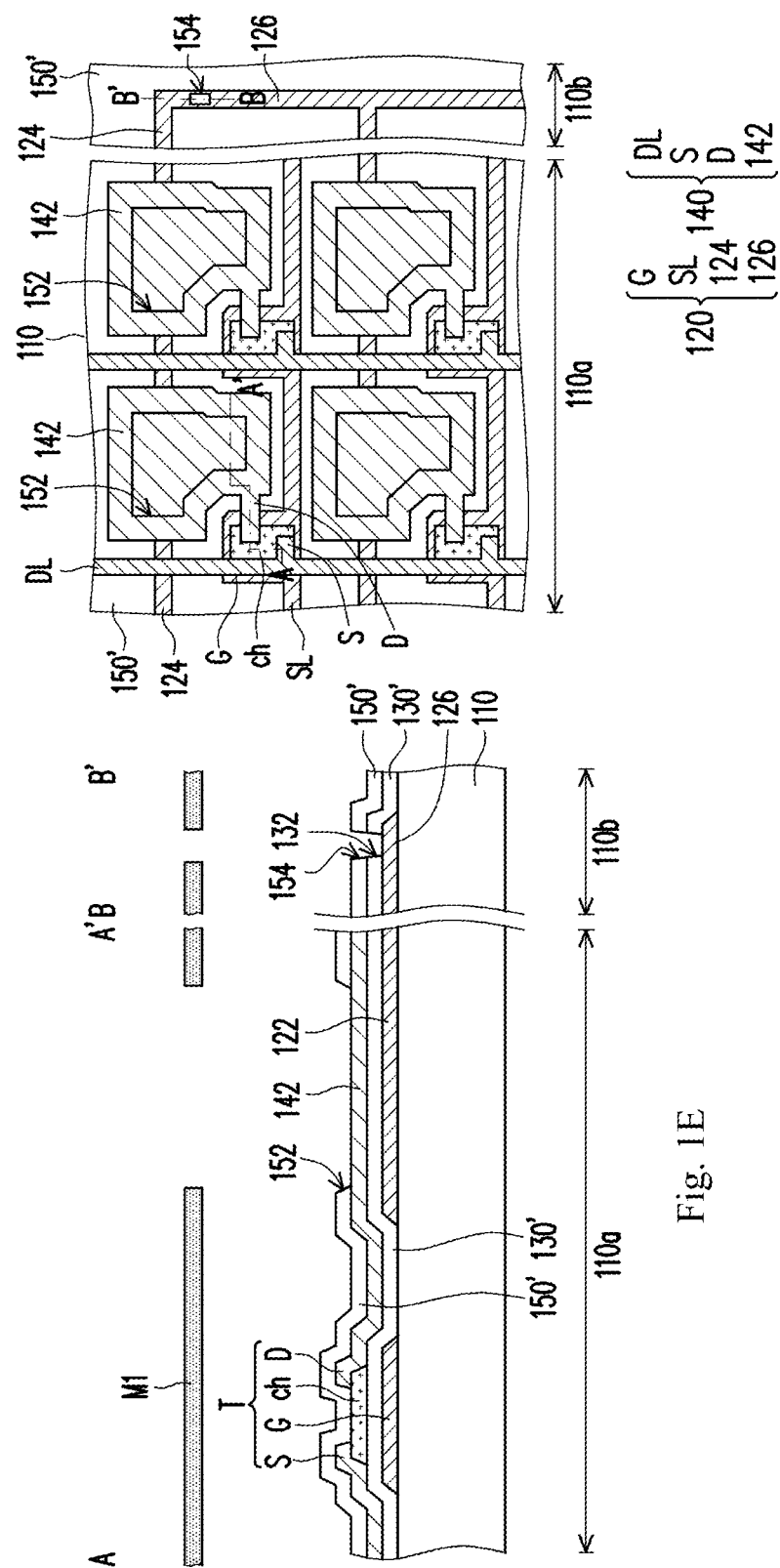

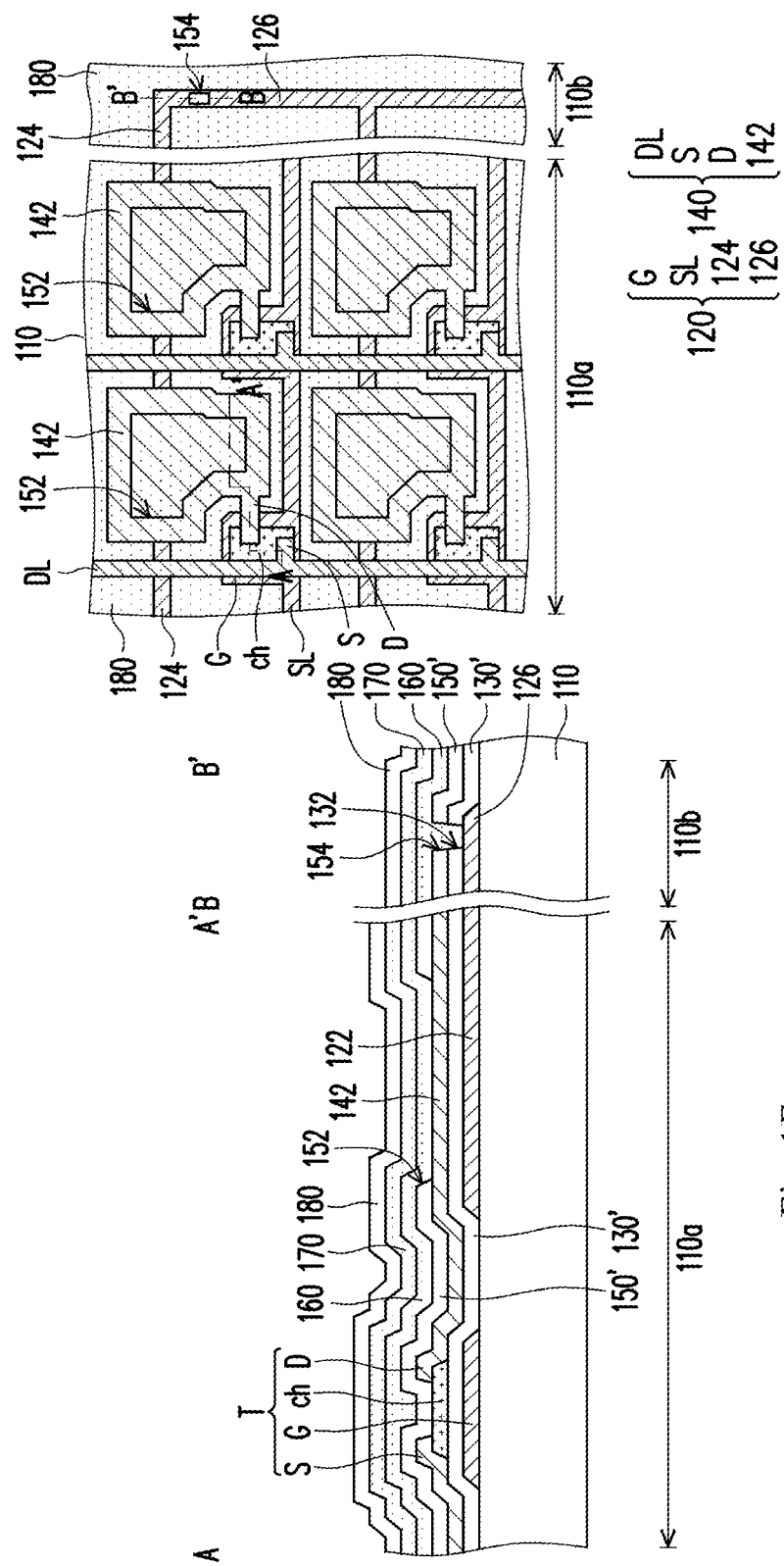

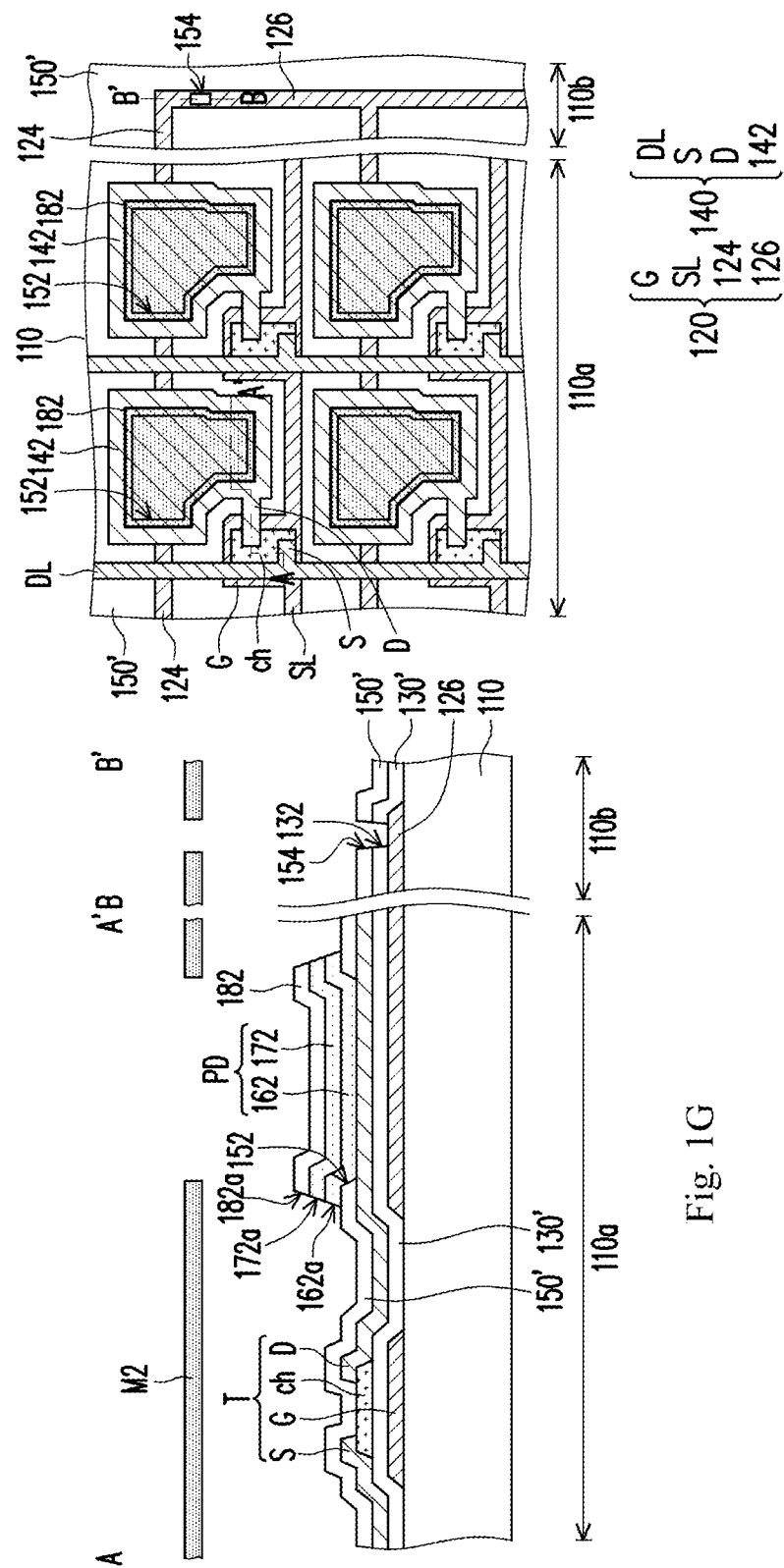

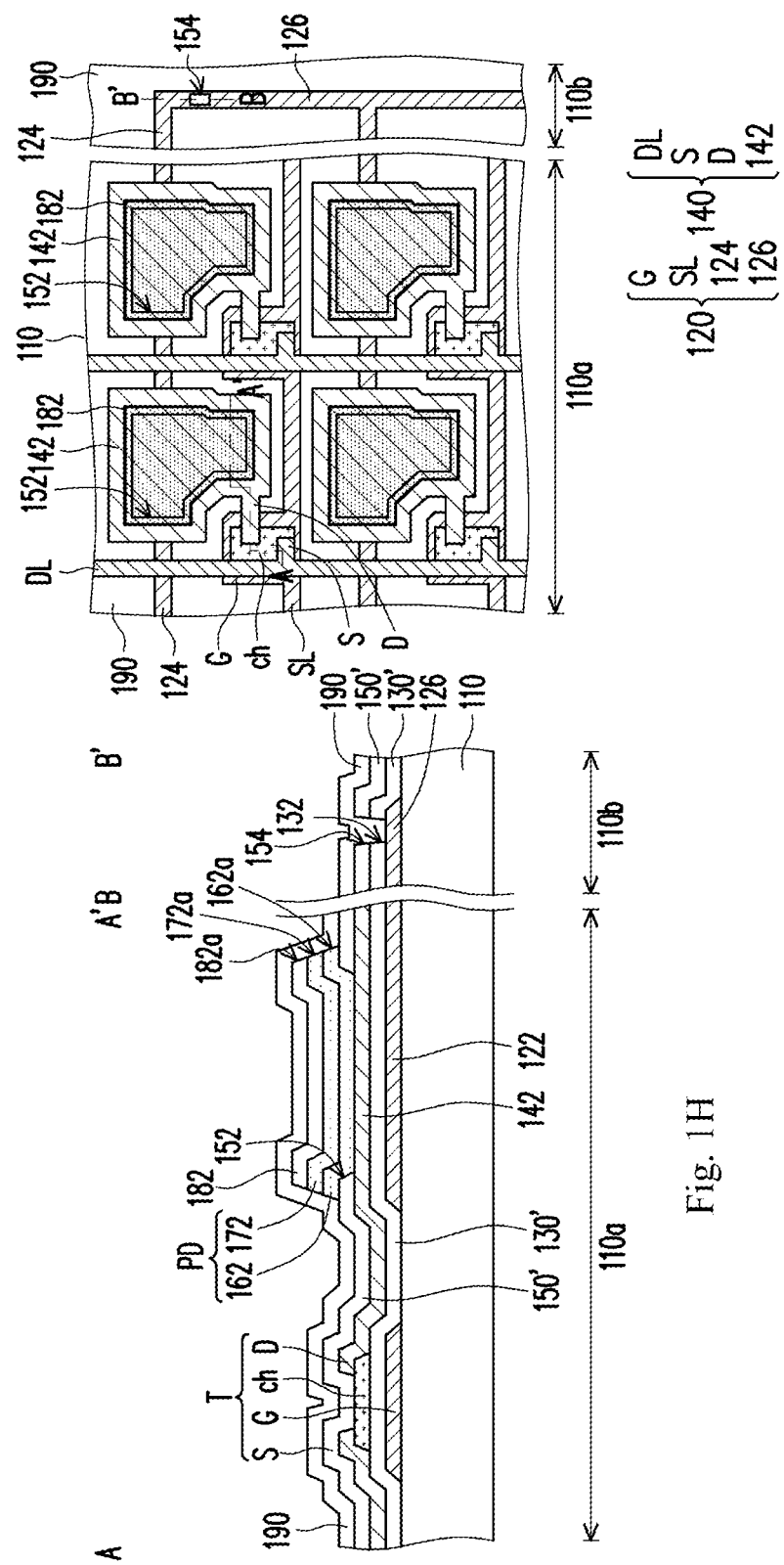

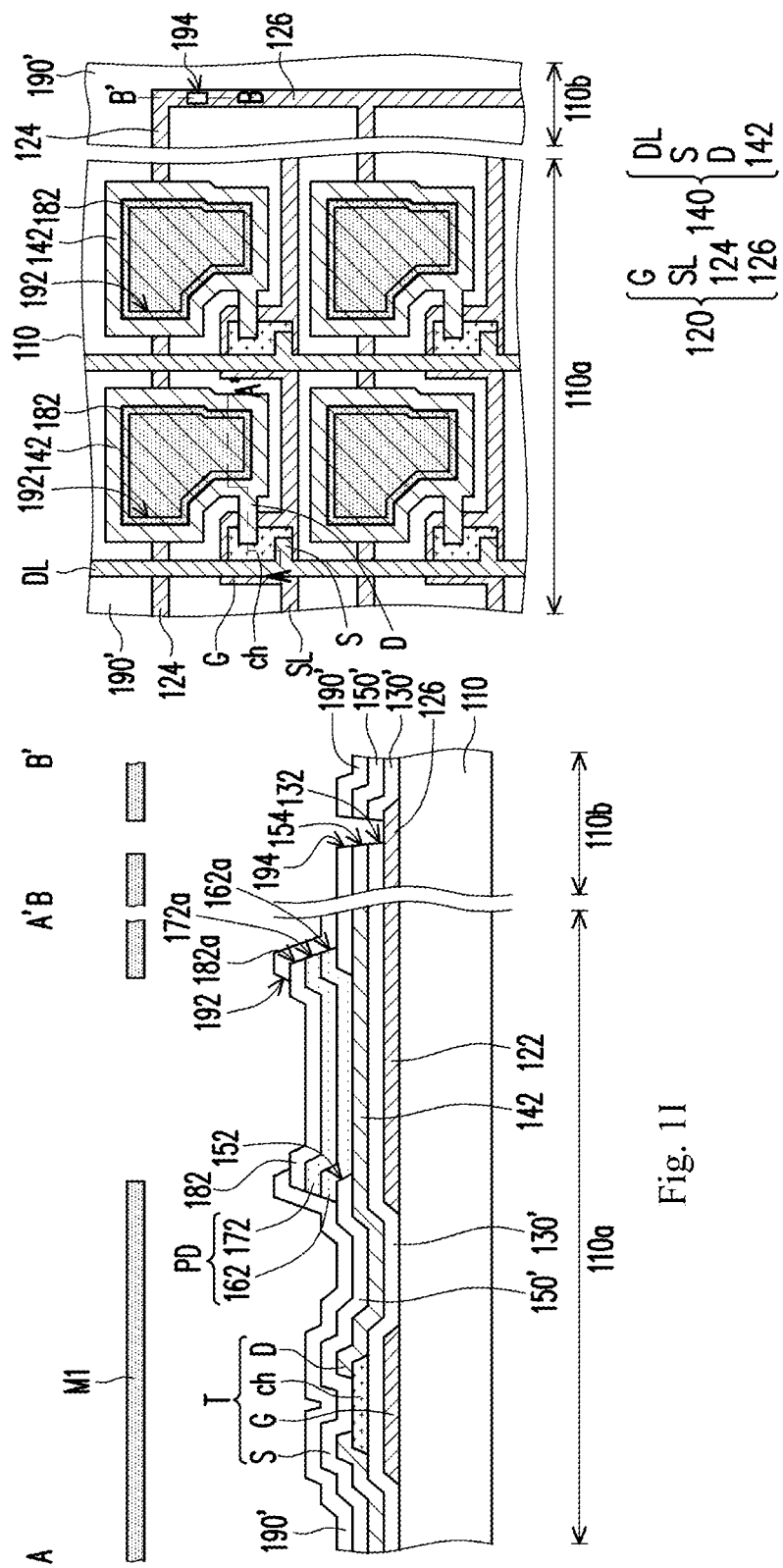

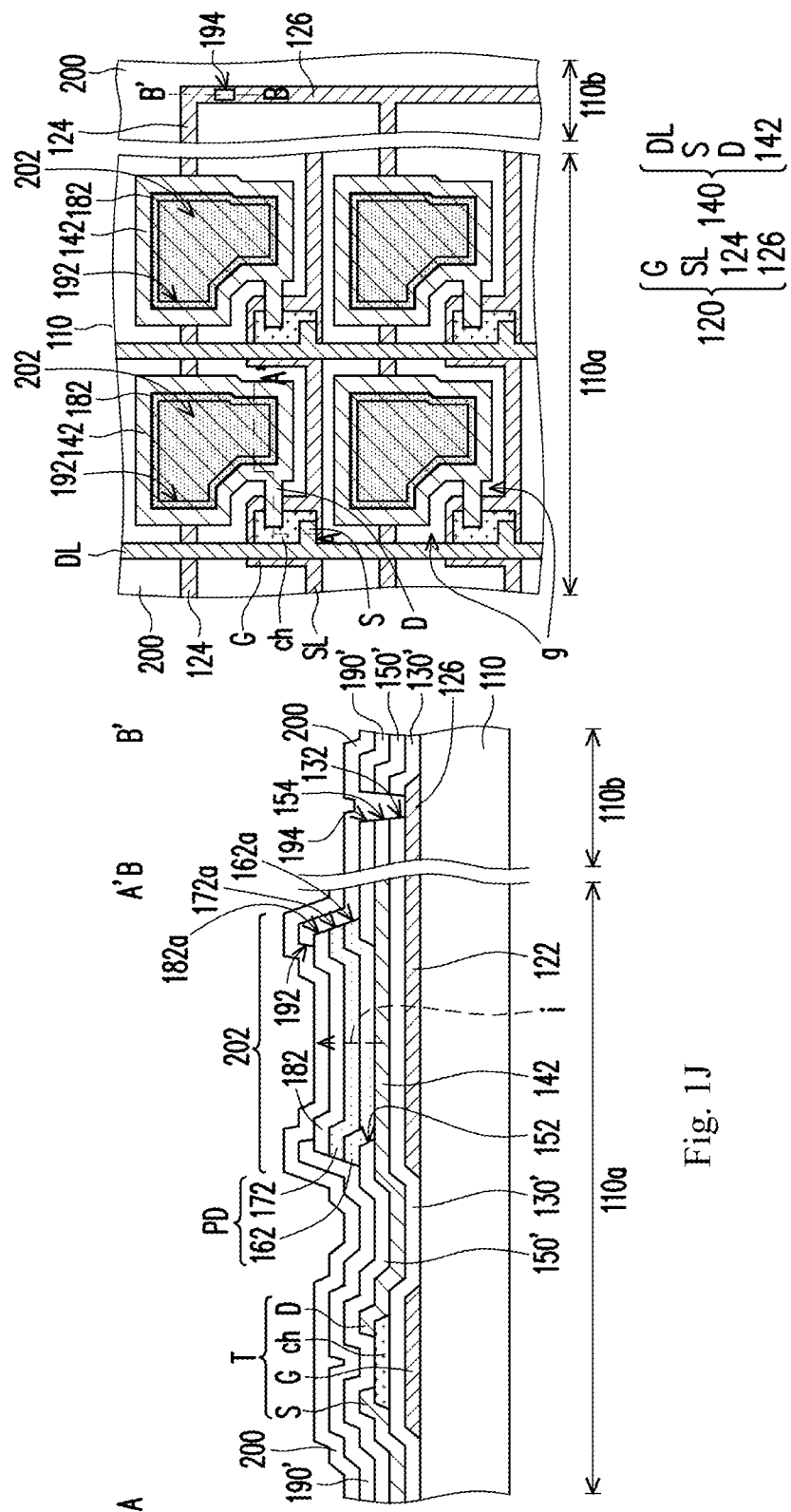

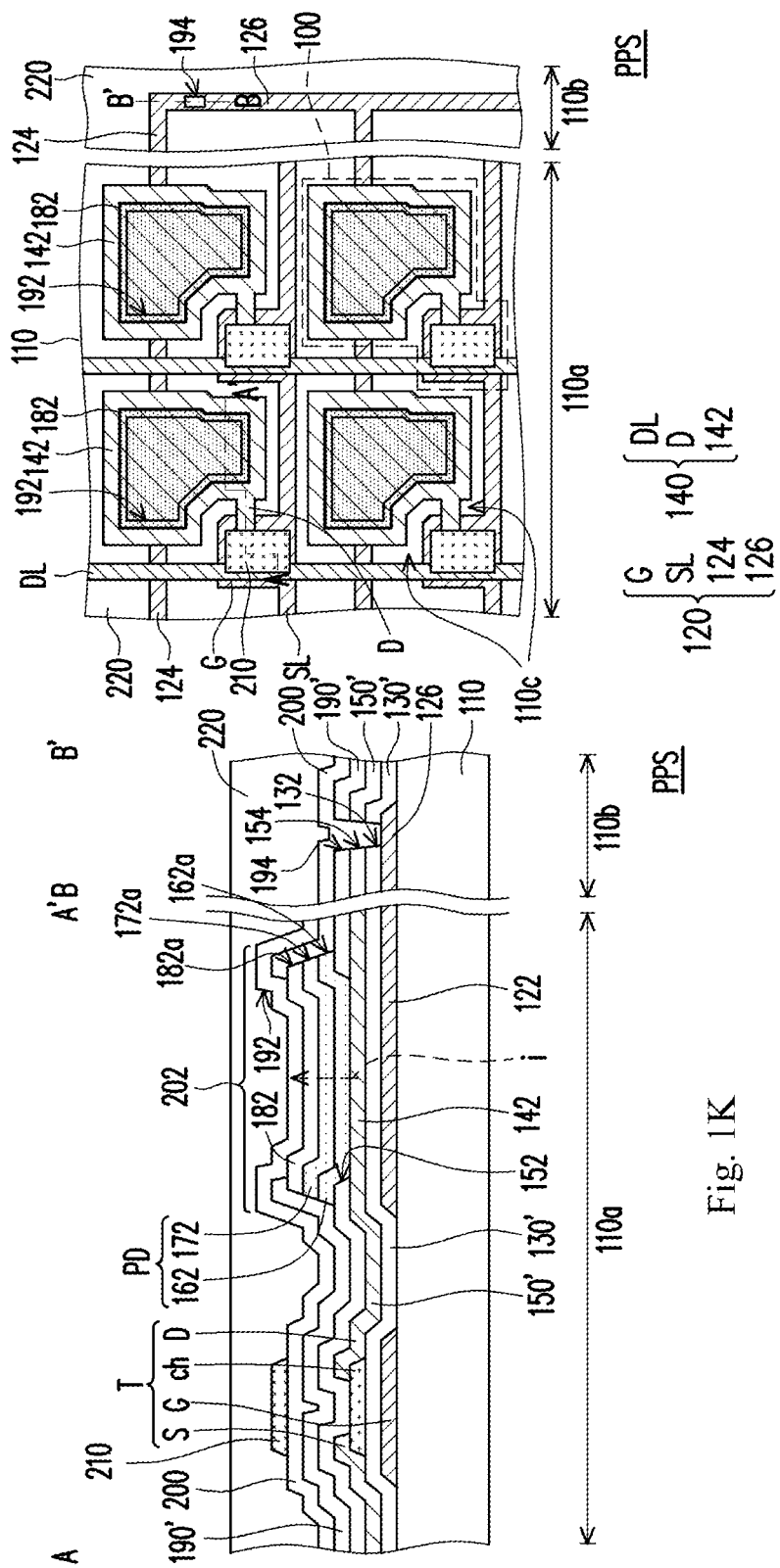

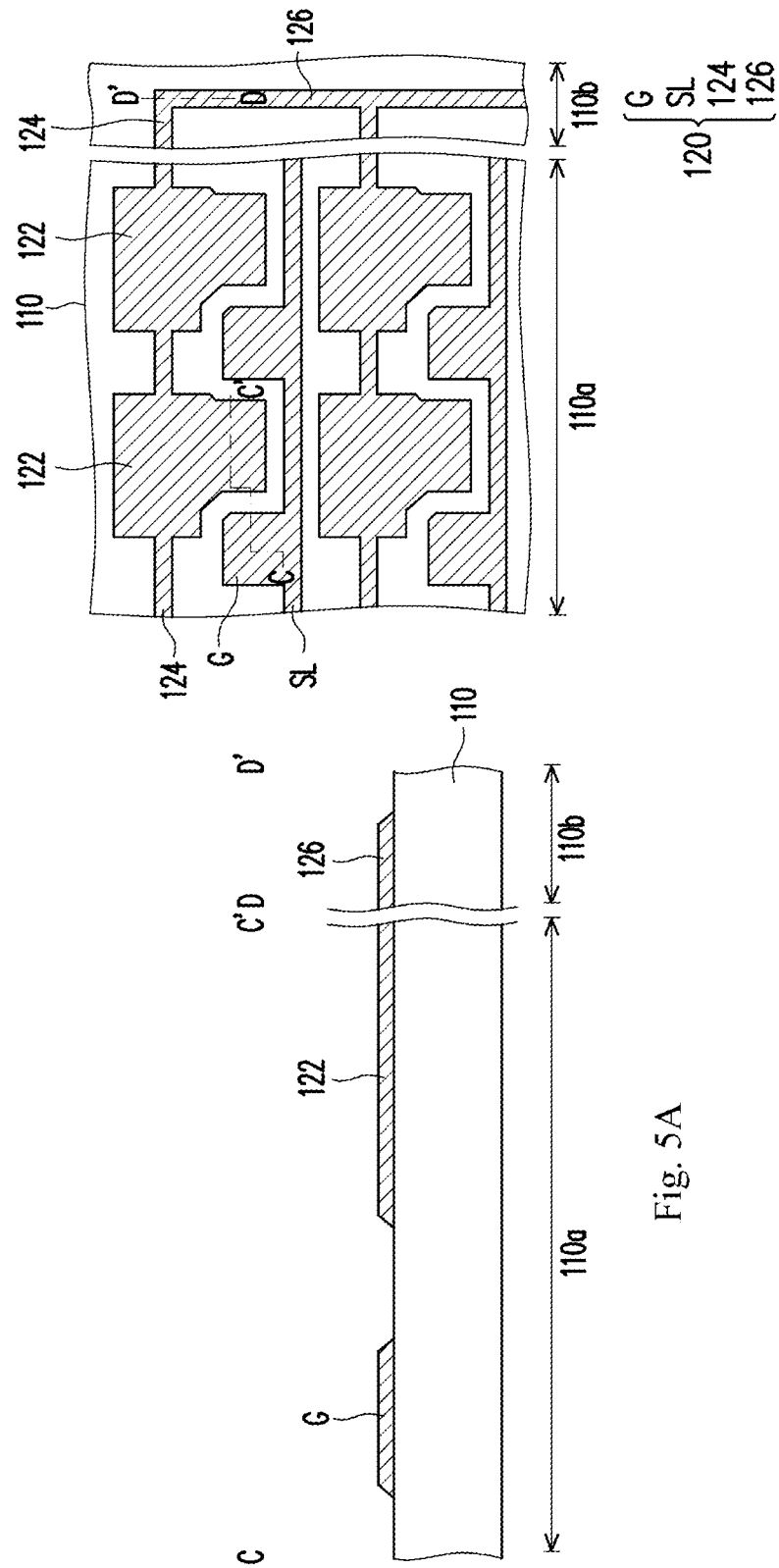

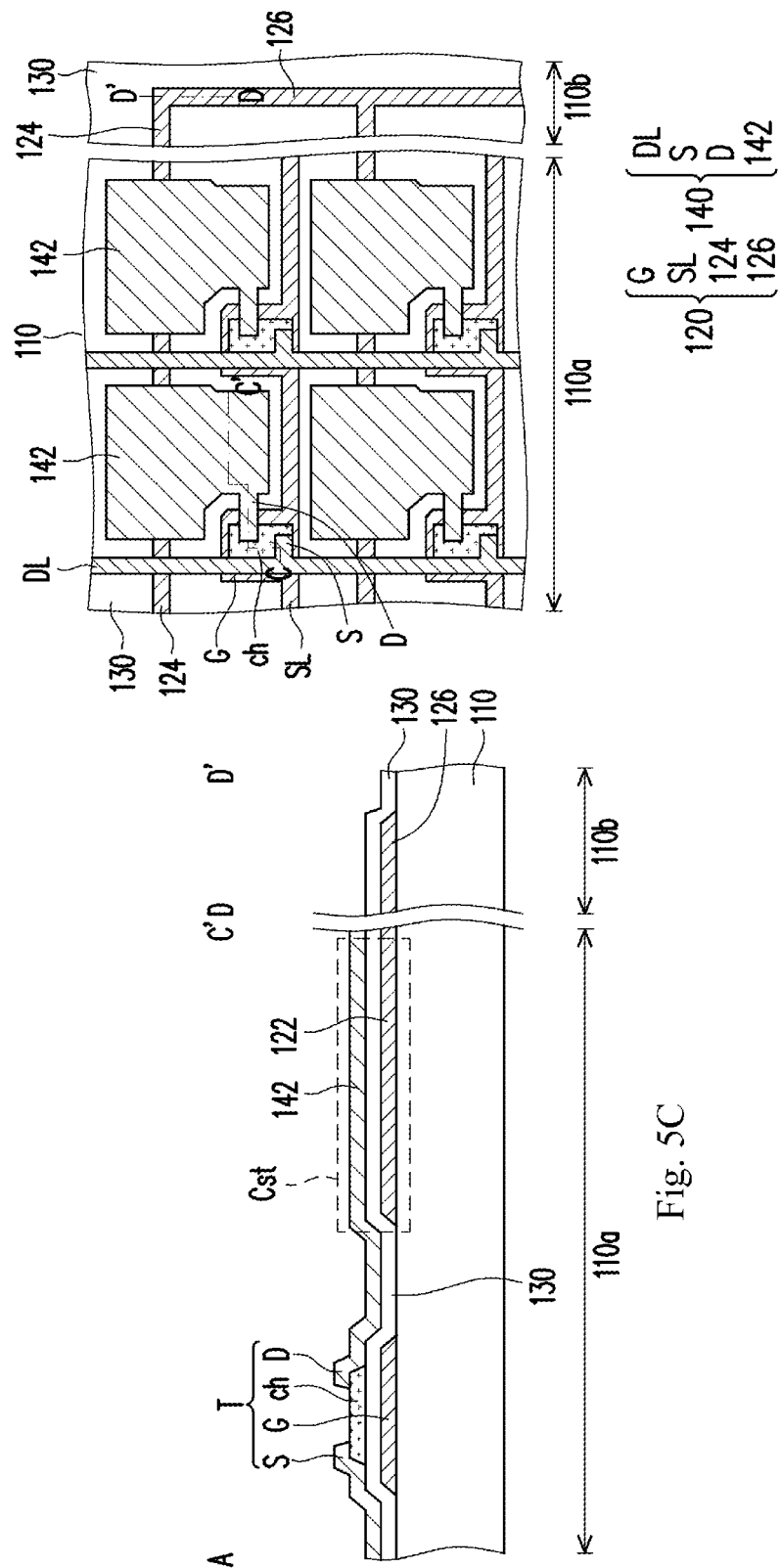

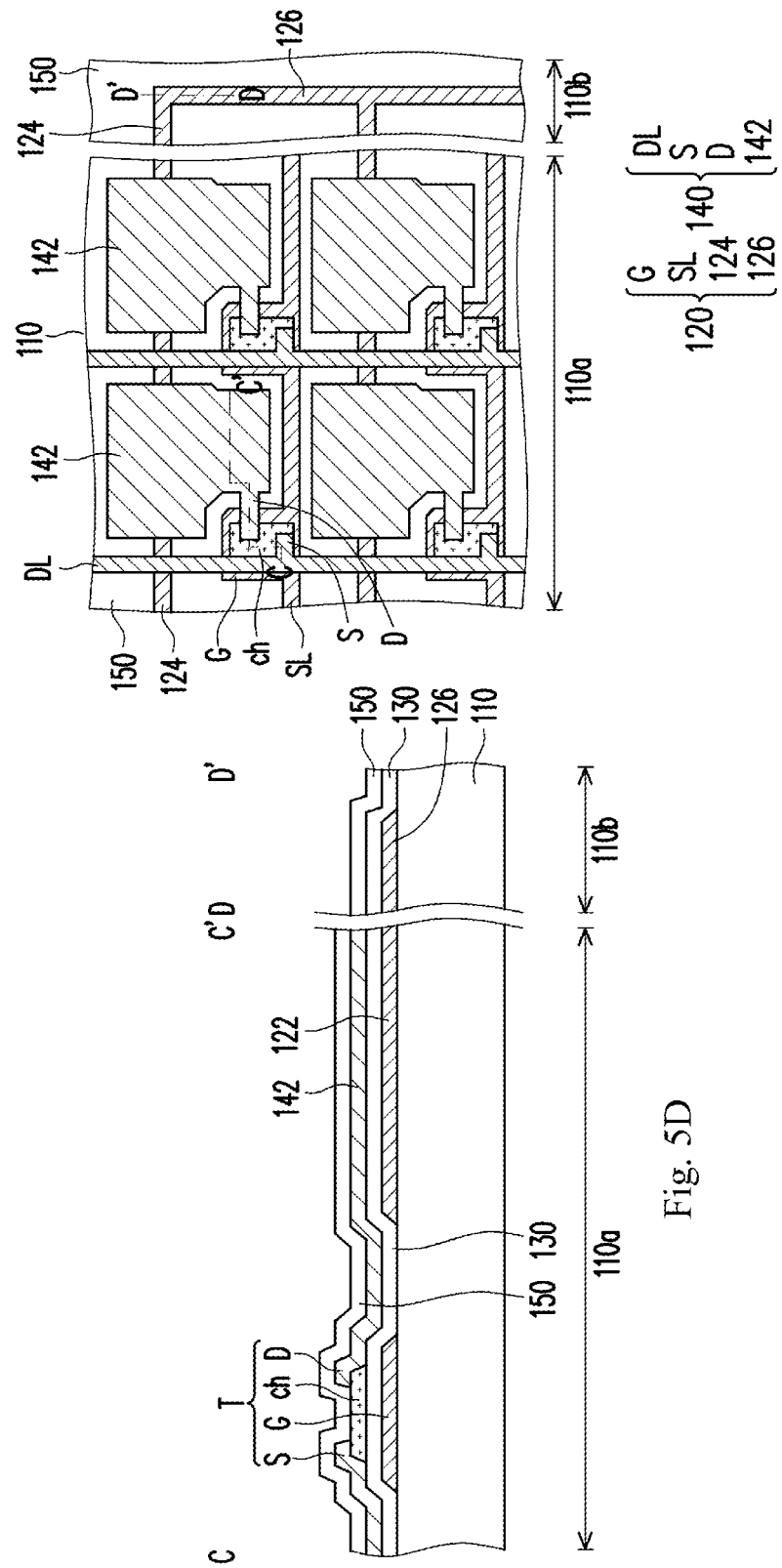

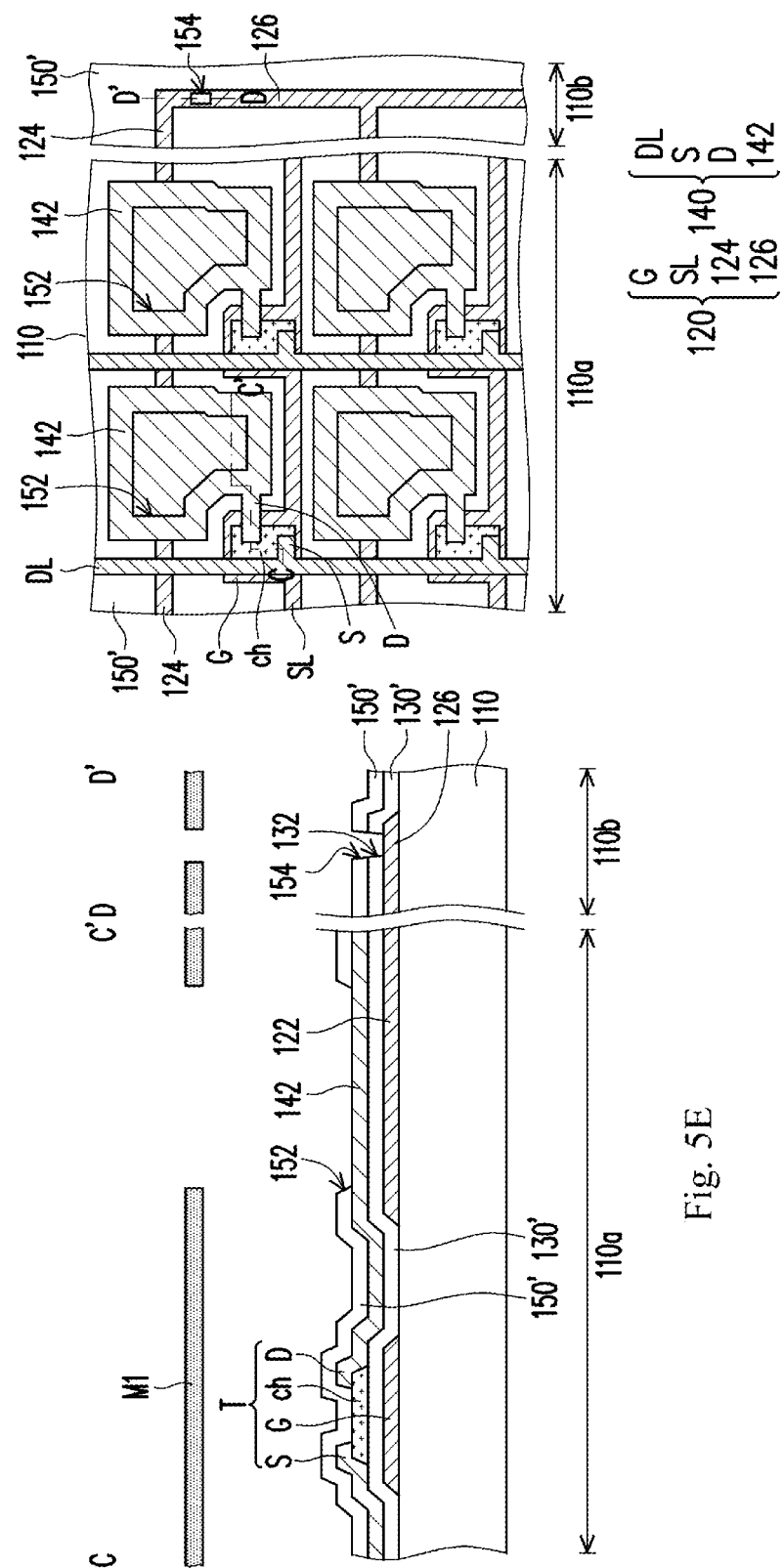

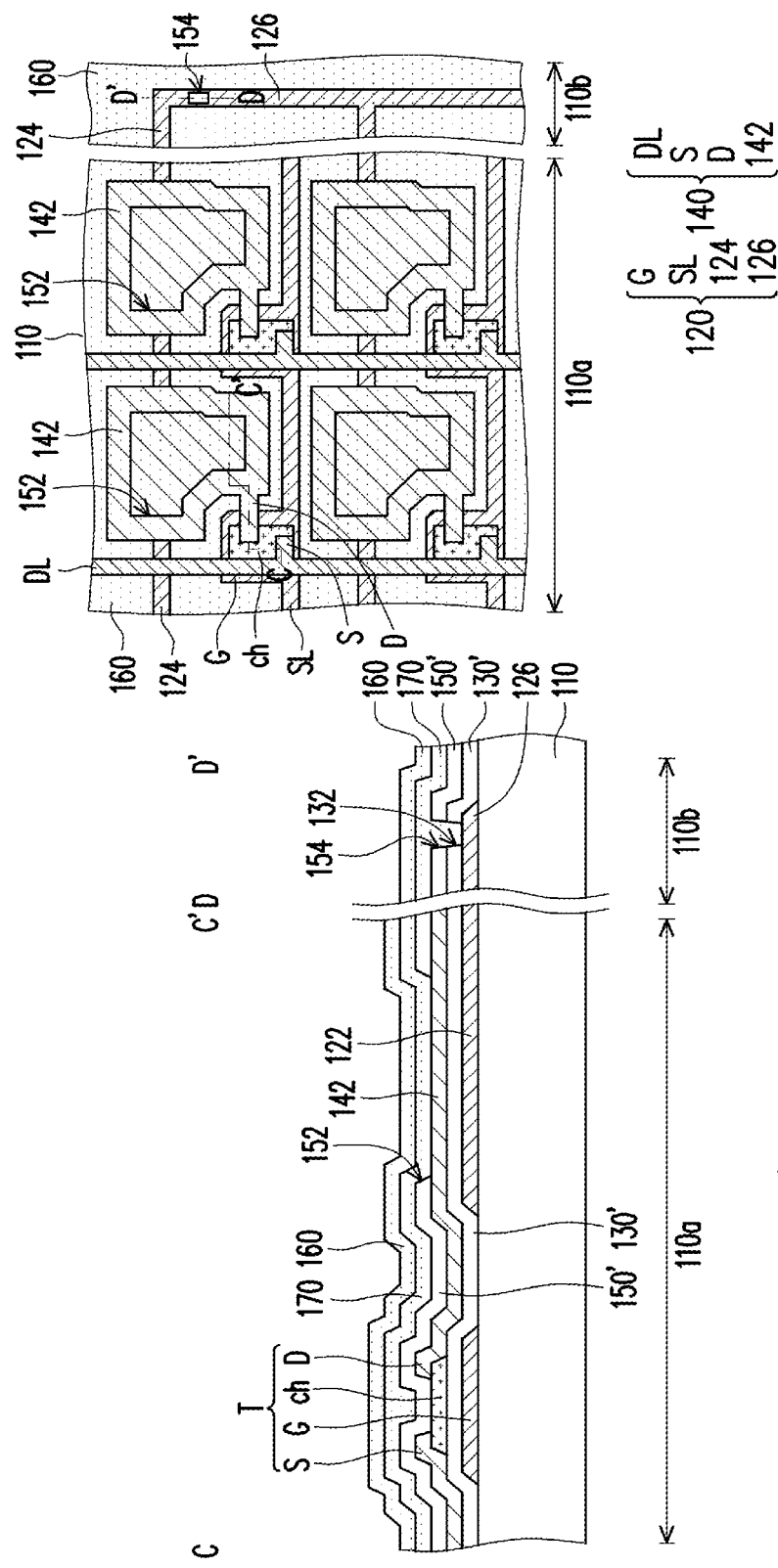

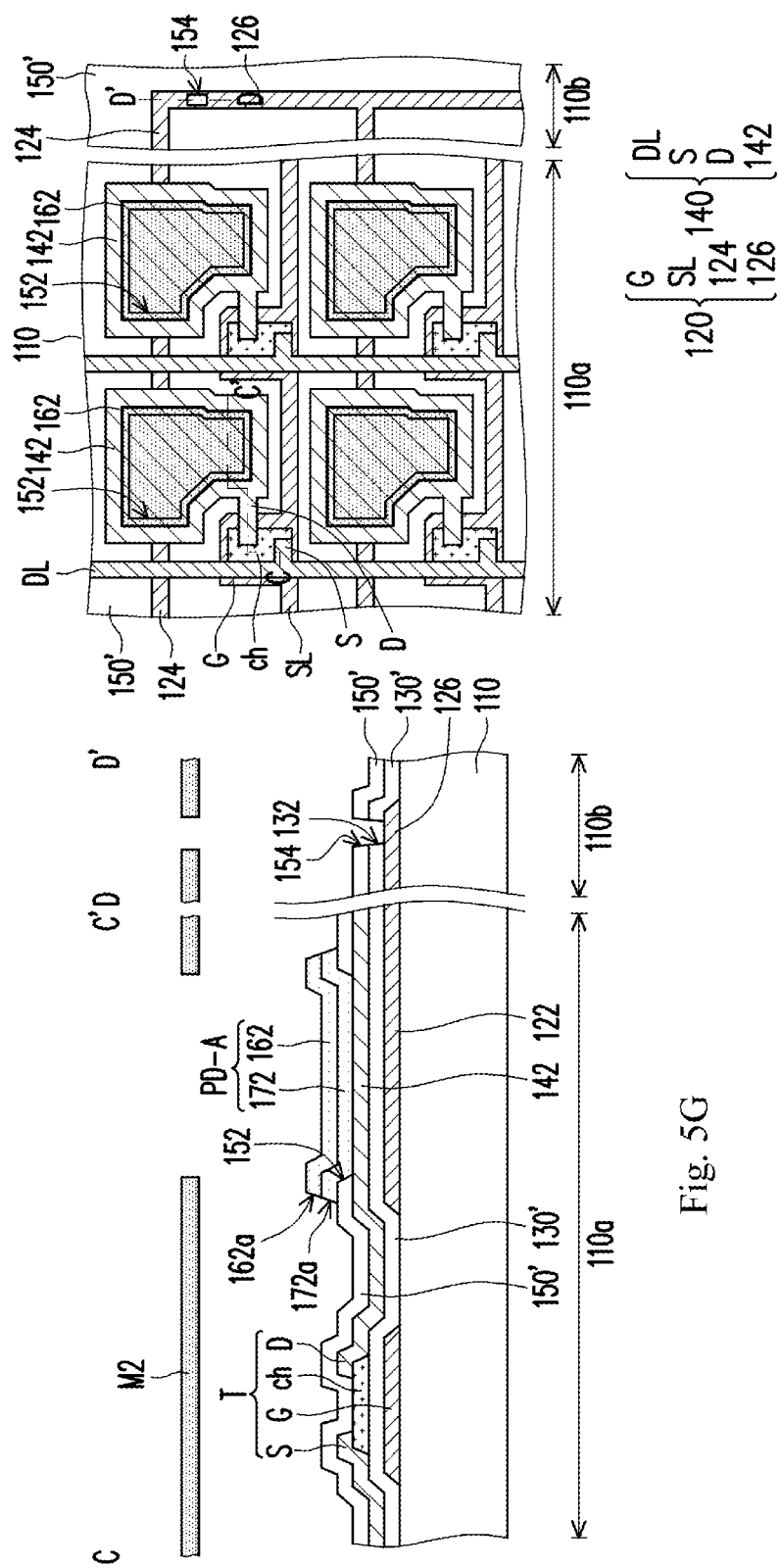

PHOTO-SENSING UNIT, PHOTO-SENSING APPARATUS, AND METHOD FOR FABRICATING PHOTO-SENSING UNIT

TECHNICAL FIELD

The present invention relates to a photo-sensing unit, photo-sensing apparatus, and method for fabricating a photo-sensing unit.

BACKGROUND ART

Generally, a pixel sensor comprises a light source and a photo-sensing panel. The light source is configured to emit a light beam. The photo-sensing panel is arranged to be on a transmitting path of the light beam. The photo-sensing panel comprises a substrate and a plurality of photo-sensing units arranged on the substrate in an array. Each of the photo-sensing units comprises a photo-sensing structure and a readout element (for example, a readout TFT) electrically connected to the photo-sensing structure.

The pixel sensor has a variety of applications. For example, in case of a fingerprint scan, when a user's finger touches the pixel sensor, peaks and valleys of the fingerprint reflect the light beam at different intensities, such that the plurality of photo-sensing structures corresponding to the peaks and valleys respectively receive the reflected light beam at different intensities. Thereby, the pixel sensor can obtain a fingerprint image of the user. In the prior art, a photo-sensing layer of the photo-sensing structure is mostly silicon rich oxide. However, the photo-sensitive spectrum of silicon rich oxide mainly lies in the visible region. In other words, the conventional pixel sensor can only sense visible light and thus is limited in scope of application.

SUMMARY OF THE INVENTION

The present invention provides a photo-sensing unit and photo-sensing apparatus, which have a wide range of applications.

The present invention provides a method for fabricating a photo-sensing unit having a wide range of applications.

The photo-sensing unit of the present invention comprises a first electrode, a first insulation layer, a photo-sensing structure, and a second electrode. The first insulation layer covers the first electrode and has a first opening uncovering the first electrode. The photo-sensing structure is located on the first electrode and disposed in the first opening of the first insulation layer. The photo-sensing structure comprises a first photo-sensing layer and a second photo-sensing layer stacked with each other. A material of the first photo-sensing layer is $Si_xGe_yO_z$ where none of x, y and z is 0. A material of the second photo-sensing layer is $Si_vO_w$ where neither v nor w is 0. The second electrode covers the photo-sensing structure.

The photo-sensing apparatus of the present invention comprises a plurality of photo-sensing units arranged in an array, a plurality of data lines electrically coupled to the photo-sensing units, a plurality of scan lines, and a light source. Each of the photo-sensing units is the photo-sensing unit described above. The scan lines are crossed by the data lines. The light source is configured to emit a light beam. The light beam is emitted from a light-transmissive region between the photo-sensing units and the data lines and the scan lines.

The method for fabricating a photo-sensing unit according to the present invention comprises the steps of providing a substrate; forming a first conductive layer on the substrate, the first conductive layer comprising a first electrode; forming a first insulation material layer to cover the first conductive layer; patterning the first insulation material layer with a first photo-mask to form a first insulation layer having a first opening, wherein the first opening exposes the first electrode; forming a photo-sensing layer to cover the first insulation layer and the first electrode exposed by the first opening; patterning the photo-sensing layer with a second photo-mask to form a photo-sensing structure, wherein the photo-sensing structure is located at the first opening of the first insulation layer and is electrically connected to the first electrode, the photo-sensing structure comprises a first photo-sensing layer and a second photo-sensing layer stacked with the first photo-sensing layer, a material of the first photo-sensing layer is $Si_xGe_yO_z$ where none of x, y and z is 0, and a material of the second photo-sensing layer is $Si_vO_w$ where neither v nor w is 0; and forming a second electrode to cover the photo-sensing structure.

In an embodiment of the present invention, the second photo-sensing layer is sandwiched between the first electrode and the first photo-sensing layer.

In an embodiment of the present invention, the photo-sensing unit further comprises a second insulation layer and a third electrode. The first opening of the first insulation layer is filled with the photo-sensing structure, and an edge of the photo-sensing structure covers a part of the first insulation layer. The second insulation layer covers a side wall of the second electrode and a side wall of the photo-sensing structure and has a second opening uncovering the second electrode. The third electrode is disposed in the second opening of the second insulation layer and is electrically connected to the second electrode.

In an embodiment of the present invention, the first photo-sensing layer is sandwiched between the first electrode and the second photo-sensing layer.

In an embodiment of the present invention, the photo-sensing unit further comprises a capacitive electrode and a third insulation layer. The capacitive electrode is located under the photo-sensing structure. The third insulation layer is arranged between the first electrode and the capacitive electrode. The first insulation layer, the second insulation layer and the third insulation layer each have a through hole. The third electrode is electrically connected to the capacitive electrode through the through hole.

In an embodiment of the present invention, the photo-sensing unit further comprises a thin film transistor (TFT) and a capacitive electrode. The thin film transistor has a gate, a semiconductor layer overlapped with the gate and a source and a drain on two sides on the semiconductor layer respectively. The drain of the thin film transistor is electrically connected to the first electrode.

In an embodiment of the present invention, the capacitive electrode shields the photo-sensing structure and the first electrode is located between the photo-sensing structure and the capacitive electrode, wherein the capacitive electrode is electrically connected to the second electrode.

In an embodiment of the present invention, $$0.5 < \frac{x}{y} < 10.$$

In an embodiment of the present invention, $$1 \leq \frac{(x+y)}{z} \leq 10.$$

In an embodiment of the present invention, the light beam is visible light, infrared light or a combination thereof.

In an embodiment of the present invention, the step of forming the photo-sensing structure and the second electrode comprises: forming the photo-sensing layer and a light-transmissive conductive layer on the photo-sensing layer; and simultaneously patterning the photo-sensing layer and the light-transmissive conductive layer with the second photo-mask, to form the photo-sensing structure and the second electrode.

In an embodiment of the present invention, the method for fabricating a photo-sensing unit further comprises: forming a second insulation material layer to cover the second electrode; patterning the second insulation material layer with the same first photo-mask, to form a second insulation layer on the second electrode, wherein the second insulation layer has a second opening exposing the second electrode; and forming a third electrode on the second electrode, wherein the third electrode is disposed in the second opening to be electrically connected to the second electrode.

In an embodiment of the present invention, the method for fabricating a photo-sensing unit further comprises: before forming the first conductive layer, forming a second conductive layer on the substrate, the second conductive layer comprising a gate and a capacitive electrode separate from the gate, wherein the capacitive electrode is located under the photo-sensing structure; forming a third insulation material layer to cover the second conductive layer; and forming a semiconductor layer on the third insulation material layer, the semiconductor layer being overlapped with the gate, wherein the first conductive layer further comprises a source and a drain, the source and the drain are located on two sides of the semiconductor layer respectively, and the drain is connected to the first electrode.

In an embodiment of the present invention, the second conductive layer further comprises forming a bus line electrically connected to the capacitive electrode, and the step of patterning the first insulation material layer with the first photo-mask to form the first insulation layer further comprises: simultaneously patterning the third insulation material layer, to form a third insulation layer and form a third opening passing through the first insulation layer and the third insulation layer, the third opening exposing the bus line.

In an embodiment of the present invention, the step of patterning the second insulation material layer with the first photo-mask further comprises: forming a fourth opening in the second insulation layer, the third opening being in communication with the fourth opening, and the third electrode being electrically connected to the bus line through the third opening and the fourth opening.

Based on the above, in addition to a second photo-sensing material layer (i.e., $Si_vO_w$) capable of absorbing visible light, the photo-sensing unit in an embodiment of the present invention further comprises a first photo-sensing material layer ($Si_xGe_yO_z$) capable of absorbing infrared light. Thus, the photo-sensing structure has a wide photo-sensitive spectrum, and can be used to detect visible light, infrared light or both. Accordingly, the photo-sensing apparatus comprising the photo-sensing structure has a wide range of applications.

In addition, because the second photo-sensing material layer (i.e., $Si_vO_w$) of the photo-sensing structure is capable of inhibiting leakage current of the first photo-sensing material layer ($Si_xGe_yO_z$), the photo-sensing apparatus comprising the photo-sensing structure has the advantages of low noise-to-signal ratio and height sensitivity.

To make the above characteristics and advantages of the present invention more clear and easier to understand, the following embodiments are described in detail in conjunction with accompanying figures.

BRIEF EXPLANATION OF DRAWINGS

FIG. 1A to FIG. 1K are schematic cross-sectional views of a method for fabricating a photo-sensing panel according to an embodiment of the present invention.

FIG. 2A to FIG. 2K are schematic top views of a method for fabricating a photo-sensing panel according to an embodiment of the present invention.

FIG. 5A to FIG. 5H are schematic cross-sectional views of a method for fabricating a photo-sensing panel according to another embodiment of the present invention.

FIG. 6A to FIG. 6H are schematic top views of a method for fabricating a photo-sensing panel according to an embodiment of the present invention.

DETAILED DESCRIPTION OF THE INVENTION

Figures 1B, 2B:
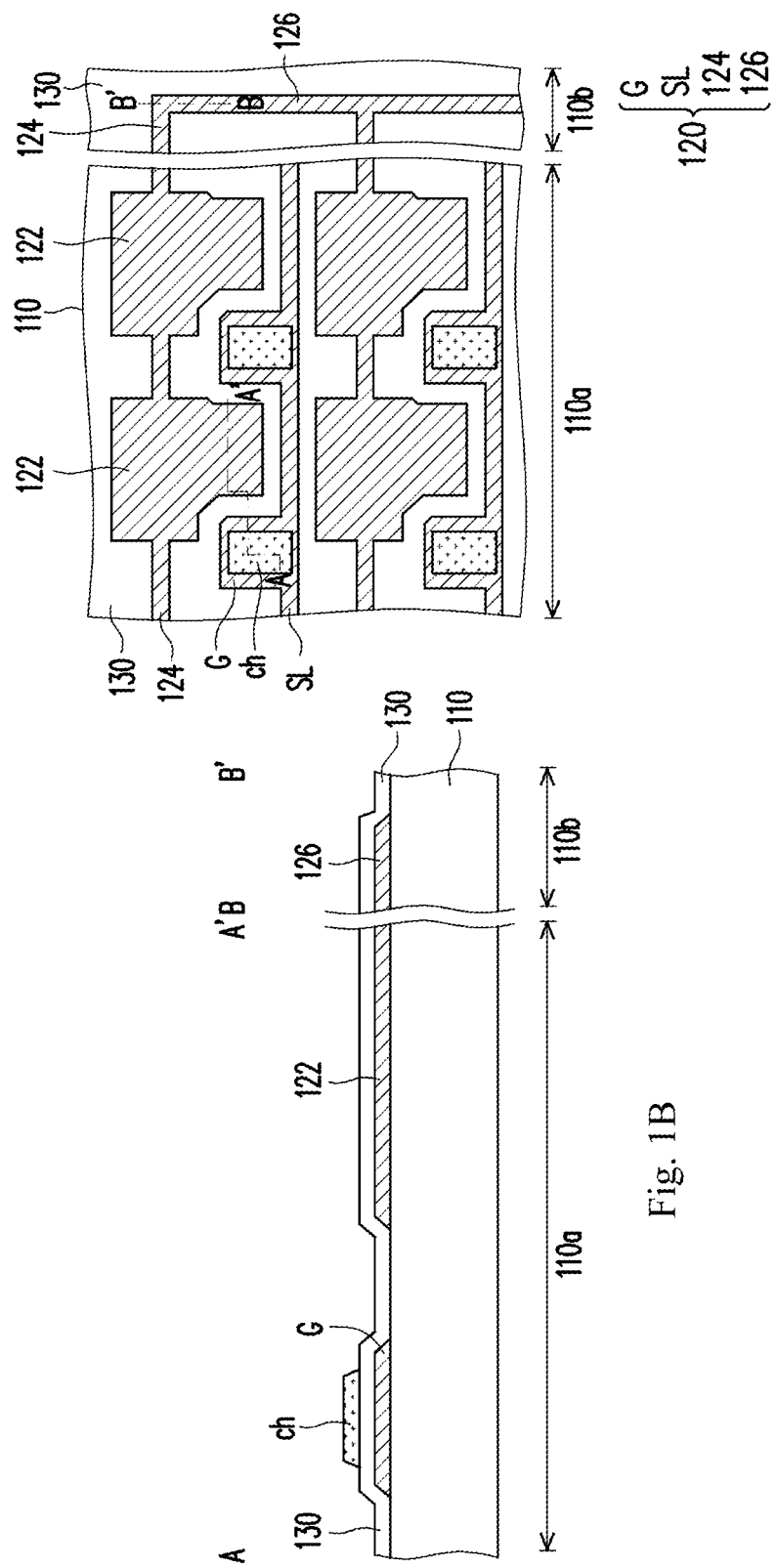

FIG. 1A to FIG. 1K are schematic cross-sectional views of a method for fabricating a photo-sensing panel according to an embodiment of the present invention. FIG. 2A to FIG. 2K are schematic top views of a method for fabricating a photo-sensing panel according to an embodiment of the present invention. In particular, FIG. 1A to FIG. 1K corresponds to cut lines A-A', B-B' in FIG. 2A to FIG. 2K. Referring to FIG. 1A and FIG. 2A, firstly, a substrate 110 is provided. The substrate 110 has a work region 110a and a peripheral region 110b outside the work region 110a. The substrate 110 may be a light-transmissive substrate or an opaque/reflecting substrate. For example, a material of the light-transmissive substrate may be glass, quartz, plastic, or other suitable materials, and a material of the opaque/reflecting substrate may be a conductive material, wafer, ceramic, or other suitable materials. However, the present invention is not limited thereto.

As shown in FIG. 1A and FIG. 2A, a conductive layer 120 is formed on the substrate 110. The conductive layer 120 comprises a plurality of gates G, a plurality of scan lines SL (as shown in FIG. 2A) and a plurality of capacitive electrodes 122 in the work region 110a. The gates G are connected to the corresponding scan lines SL. The capacitive electrodes 122 are separated from the gates G and the scan lines SL. In this embodiment, the conductive layer 120 also comprises a plurality of connecting lines 124 (as shown in FIG. 2A) and a bus line 126. Each of the connecting lines 124 is electrically connected in series to the capacitive electrodes 122 in a same row. The connecting lines 124 extend from the work region 110a to the peripheral region 110b to be electrically connected to the bus line 126 in the peripheral region 110b. In this embodiment, the conductive layer 120 is for example a metal material, but the present invention is not limited thereto. In other embodiments, the conductive layer 120 also may be made of other conductive materials (for example, alloy, metal nitrides, metal oxides, metal oxynitrides, or stacked layers of metals and other conductive materials).

Referring to FIG. 1B and FIG. 2B, then an insulation material layer 130 is formed to cover the conductive layer 120. In particular, in this embodiment, the insulation material layer 130 may be comprehensively formed (blanket-formed) on the substrate 110 to cover the gates G, the scan lines SL, the capacitive electrodes 122, the connecting lines 124, and the bus line 126. However, the present invention is not limited thereto. A material of the insulation material layer 130 may be an inorganic material (for example, silicon oxide, silicon nitride, silicon oxynitride, or a stacked layer of at least two of the above-mentioned materials), an organic material or a combination thereof. Then, a semiconductor layer may be formed on the insulation material layer 130. The semiconductor layer comprises a plurality of semiconductor patterns ch separated from each other. Each of the semiconductor patterns ch is overlapped with a corresponding one of the gates G. In the present embodiment, the semiconductor patterns ch may be a single-layer structure or a multilayer structure, including amorphous silicon, polycrystalline silicon, microcrystalline silicon, monocrystalline silicon, organic semiconductor materials, oxide semiconductor materials (for example, indium zinc oxide, indium germanium zinc oxide, or other suitable materials, or combinations thereof), or other suitable materials, or the above-mentioned materials containing dopant, or combinations thereof.

Referring to FIG. 1C and FIG. 2C, then a conductive layer 140 is formed on the substrate 110. In the present embodiment, the conductive layer 140 is arranged on the insulation material layer 130. The conductive layer 140 comprises a plurality of data lines DL (as shown in FIG. 2C), a plurality of sources S, a plurality of drains D, and a plurality of first electrodes 142. The scan lines SL are crossed by the data lines DL. The sources S are connected to the corresponding data lines DL, and each of the sources S and a corresponding one of the drains D are located on two sides of the same one of the semiconductor patterns ch, respectively. A thin film transistor T may be formed by the semiconductor pattern ch and the corresponding source S, drain D and gate G. As shown in FIG. 1C, in the present embodiment, the gates G may be located under the semiconductor patterns ch. In other words, the thin film transistors T may be bottom gate TFTs. However, the present invention is not limited thereto, and in other embodiments, the thin film transistors T may also be top gate TFTs or other types of thin film transistors.

Referring to FIG. 2C, the plurality of first electrodes 142 are separate from each other. Each of the first electrodes 142 is electrically connected to a corresponding one of the drains D. As shown in FIG. 1C, a storage capacitor Cst may be formed by the first electrode 142, one of the capacitive electrodes 122 overlapped with the first electrode 142, and a part of the insulation material layer 130 sandwiched between the first electrode 142 and the capacitive electrode 122. In the present embodiment, the conductive layer 140 is for example a metal material, but the present invention is not limited thereto. In other embodiments, the conductive layer 140 also may be other conductive materials (for example, alloy, metal nitrides, metal oxides, metal oxynitrides, or stacked layers of metals and other conductive materials).

Figure 2D:
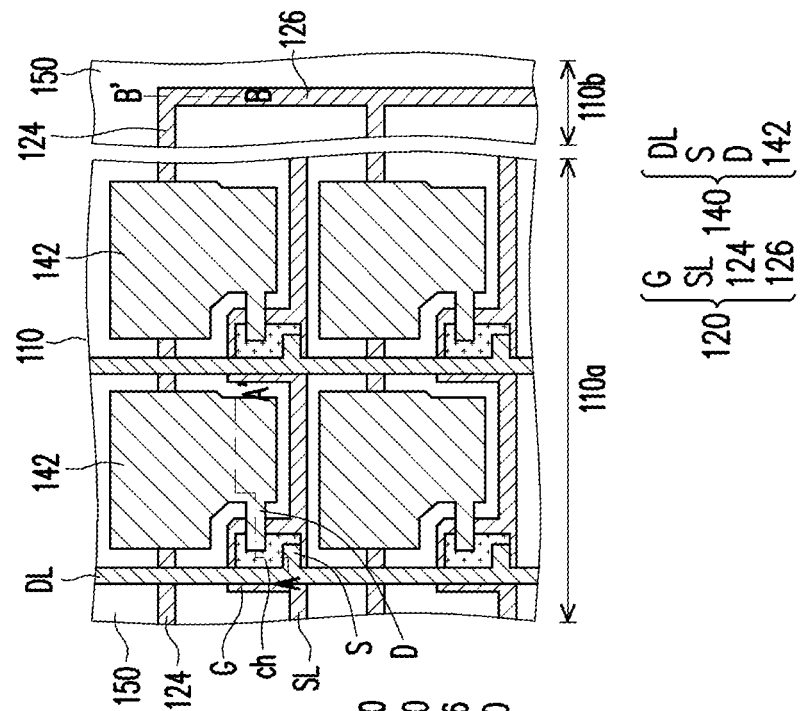
Figure 1D:
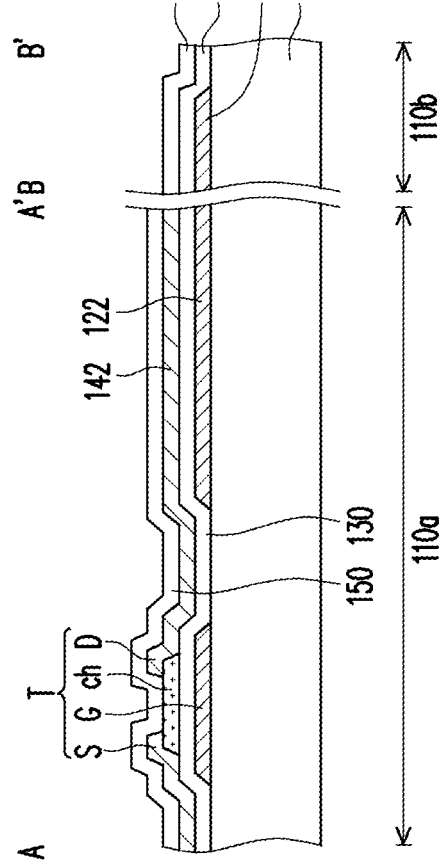

Referring to FIG. 1D and FIG. 2D, then an insulation material layer 150 is formed to cover the conductive layer 140. In particular, in the present embodiment, the insulation material layer 150 covers the plurality of data lines DL, the plurality of sources S, the plurality of drains D, and the plurality of first electrodes 142 in the work region 110a. In addition, the insulation material layer 150 may further cover the bus line 126 in the peripheral region 110b. A material of the insulation material layer 150 may be an inorganic material (for example, silicon oxide, silicon nitride, silicon oxynitride, or a stacked layer of at least two of the above-mentioned materials), an organic material or a combination thereof.

Referring to FIG. 1E and FIG. 2E, then the insulation material layer 150 (as shown in FIG. 1D and FIG. 2D) is patterned with a photo-mask M1 as a mask, to form an insulation layer 150'. For example, using photolithography and etching or laser ablation process with the photo-mask M1, the insulation material layer 150 is patterned to form the insulation layer 150'. The insulation layer 150' has a plurality of openings 152. Each of the openings 152 exposes a corresponding one of the first electrodes 142. In the present embodiment, an opening 154 in the peripheral region 110b is formed when the plurality of openings 152 in the work region 110a is patterned. Since no conductive layer 140 is provided directly under the opening 154, when the opening 154 is patterned, the insulation material layer 130 (as shown in FIG. 1D and FIG. 2D) directly under the opening 154 is also patterned, thereby forming an insulation layer 130' having an opening 132. The openings 132, 154 extend through the insulation layers 130' and 150' respectively, and are in communication with each other. The openings 132, 154 may be regarded as one through hole. The through hole exposes the bus line 126. An orthographic projection of the opening 154 on the substrate 110 may substantially match an orthographic projection of the opening 132 on the substrate 110, but the present invention is not limited thereto.

Referring to FIGS. 1F-1G and FIGS. 2F-2G, then, photo-sensing structures PD (as shown in FIG. 1G and FIG. 2G) and second electrodes 182 (as shown in FIG. 1G and FIG. 2G) are formed. In particular, as shown in FIG. 1F and FIG. 2F, in the present embodiment, a photo-sensing layer comprising a first photo-sensing material layer 160 and a second photo-sensing material layer 170, and a light-transmissive conductive layer 180 covering the photo-sensing layer may be firstly formed on the insulation layer 150'. As shown in FIG. 1F, in the present embodiment, the first photo-sensing material layer 160, the second photo-sensing material layer 170 and the light-transmissive conductive layer 180 may be optionally sequentially formed. However, the present invention is not limited thereto, and in other embodiments, the order of formation may be sequentially the second photo-sensing material layer 170, the first photo-sensing material layer 160 and the light-transmissive conductive layer 180.

A material of the first photo-sensing material layer 160 is $Si_xGe_yO_z$ where none of x, y and z is 0. A material of the second photo-sensing material layer 170 is $Si_vO_w$ where neither v nor w is 0. In the present embodiment, $$0.5 < \frac{x}{y} < 10; 1 \leq \frac{(x+y)}{z} \leq 10.$$

For example, $$\frac{x}{y} = 4; \frac{(x+y)}{z} = 5.$$

By appropriately setting the relative sizes of x, y and z, namely, appropriately setting the germanium (Ge) concentration of the first photo-sensing material layer 160, the photo-sensing structures PD can account for both infrared-absorbing ability and control of lattice defect. In the present embodiment, a material of the light-transmissive conductive layer 180 may be selected from metal oxides, for example, indium tin oxide, indium zinc oxide, aluminum tin oxide, aluminum zinc oxide, indium germanium zinc oxide, other suitable oxides, or stacked layers of at least two of the above-mentioned materials. However, the present invention is not limited thereto.

Then, as shown in FIG. 1G and FIG. 2G, the first photo-sensing material layer 160, the second photo-sensing material layer 170 and the light-transmissive conductive layer 180 are simultaneously patterned with a photo-mask M2 as a mask, to form a plurality of first photo-sensing layers 162 separate from each other, a plurality of second photo-sensing layers 172 separate from each other, and a plurality of second electrodes 182 separate from each other. One of the first photo-sensing layers 162 and one of the second photo-sensing layers 172 stacked directly above the same one of the first electrodes 142 may form one of the photo-sensing structures PD. In the present embodiment, because the plurality of first photo-sensing layers 162, the plurality of second photo-sensing layers 172 and the plurality of second electrodes 182 are patterned with the same photo-mask M2, orthographic projections of the first photo-sensing layer 162, the second photo-sensing layer 172 and the second electrode 182 of each of the photo-sensing structures PD on the substrate 110 may be substantially matched with each other, but the present invention is not limited thereto.

Figure 3:
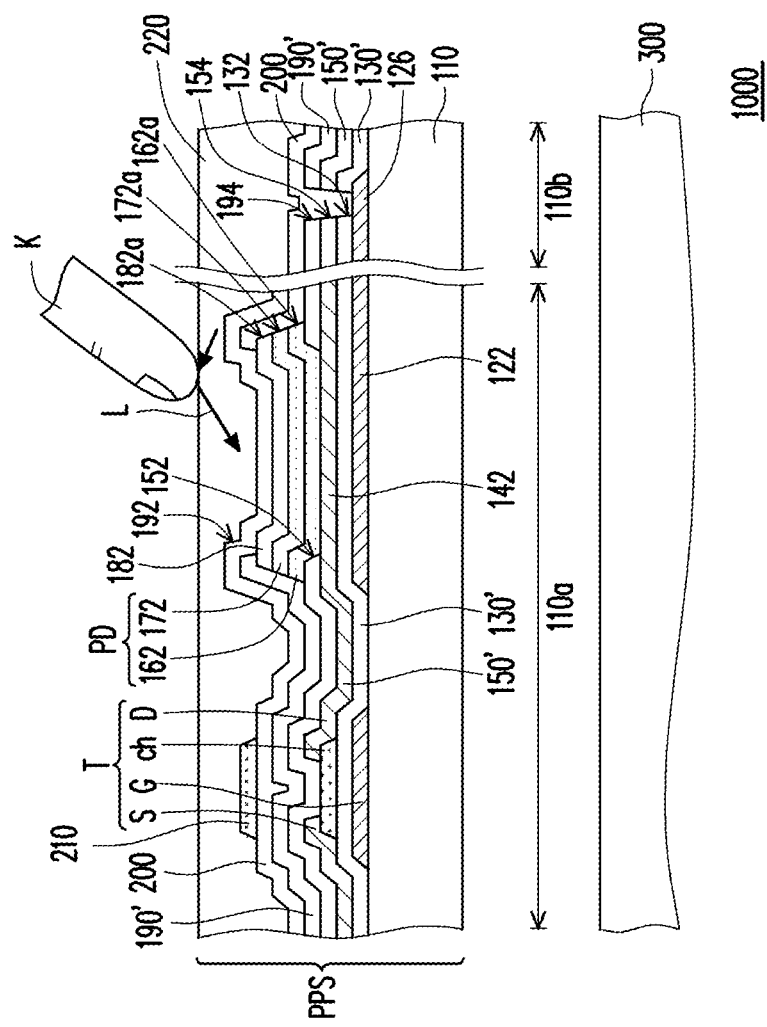
FIG. 3 is a schematic view of a photo-sensing apparatus according to an embodiment of the present invention.

Referring to FIG. 1G and FIG. 2G, each photo-sensing structure PD is located on a corresponding one of the first electrodes 142 and disposed in a corresponding one of the openings 152 to be electrically connected to a corresponding one of the first electrodes 142. Further, in the present embodiment, the corresponding opening 152 may be filled with the photo-sensing structure PD, and an edge (i.e., side walls 162a, 172a) of the photo-sensing structure PD may cover a part of the insulation layer 150'. In addition, the second electrodes 182 cover the corresponding photo-sensing structures PD to be electrically connected to the corresponding photo-sensing structures PD. The first electrodes 142 are located between the photo-sensing structures PD and the capacitive electrodes 122. The capacitive electrodes 122 shields the corresponding photo-sensing structures PD, such that a light beam from a light source 300 (as shown in FIG. 3) is less likely to enter the photo-sensing structures PD to affect the performance of the photo-sensing panel.

Again referring to FIG. 1F, in the present embodiment, the first photo-sensing material layer 160 and then the second photo-sensing material layer 170 may be optionally formed in sequence. Thus, as shown in FIG. 1G, in the photo-sensing structure PD, the second photo-sensing layer 172 formed from the second photo-sensing material layer 170 is located at an upper position and the first photo-sensing layer 162 formed from the first photo-sensing material layer 160 is located at a lower position. In other words, in the present embodiment, the first photo-sensing layers 162 may be sandwiched between the first electrodes 142 and the second photo-sensing layers 172. However, the present invention is not limited thereto, and in other embodiments, the order of forming may be the second photo-sensing material layer 170 and then the first photo-sensing material layer 160; namely, in other embodiments, the second photo-sensing layers 172 may be sandwiched between the first electrodes 142 and the first photo-sensing layers 162.

Referring to FIG. 1H and FIG. 2H, then an insulation material layer 190 is formed to cover the plurality of second electrodes 182. In particular, in the present embodiment, the insulation material layer 190 further covers the side walls 182a of the second electrodes 182, side walls 162a of the first photo-sensing layers 162, side walls 172a of the second photo-sensing layers 172, and a part of the insulation layer 150'. In addition, the insulation material layer 190 is further disposed in the openings 154, 132, to cover a part of the bus line 126. A material of the insulation material layer 190 may be an inorganic material (for example, silicon oxide, silicon nitride, silicon oxynitride, or a stacked layer of at least two of the above-mentioned materials), an organic material or a combination thereof.

Referring to FIG. 1I and FIG. 2I, then the insulation material layer 190 is patterned with the abovementioned photo-mask M1 as a mask, to form an insulation layer 190' on the second electrodes 182. For example, using photolithography and etching or laser ablation process with the photo-mask M1, the insulation material layer 190 is patterned to form the insulation layer 190'. The insulation layer 190' has a plurality of openings 192 exposing the plurality of second electrodes 182. In the process of patterning the openings 192, the second electrodes 182 can protect the photo-sensing structures PD thereunder from being damaged. In addition, the insulation layer 190' also has an opening 194 exposing the bus line 126. In the present embodiment, because the insulation layers 190', 150, 130' are patterned with the same photo-mask M1, the openings 194, 154, 132 of the insulation layers 190', 150', 130' are substantially flush with and in communication with each other, to form one through hole; similarly, an orthographic projection of the opening 192 of the insulation layer 190' on the substrate 110 may be substantially matched with that of the opening 154 of the insulation layer 150' on the substrate 110. However, the present invention is not limited thereto. It is to be noted that, since the insulation layers 190', 150, 130' are fabricated with the same photo-mask M1, the arrangement of the insulation layer 190' for improving leakage phenomenon does not result in an excessive increase in cost of manufacture of the photo-sensing panel.

Referring to FIG. 1J and FIG. 2J, then, a conductive layer 200 having a plurality of third electrodes 202 (as shown in FIG. 1J) is formed on the plurality of second electrodes 182. The third electrodes 202 are disposed in the corresponding openings 192 to be electrically connected to the corresponding second electrodes 182. Each of the third electrodes 202 is further electrically connected to a corresponding one of the capacitive electrodes 122. For example, as shown in FIG. 2J, in the present embodiment, the conductive layer 200 may optionally be a whole-face pattern, to comprehensively cover (blanket-cover) the work region 110a and the peripheral region 110b of the substrate 110. In other words, as shown in FIG. 1J, the third electrodes 202 directly above the photo-sensing structures PD may be regarded as a part of the conductive layer 200. A part of the conductive layer 200 in the peripheral region 110b is disposed in the openings 194, 154, 132 to be electrically connected to the bus line 126, such that each third electrode 202 is electrically connected to the corresponding capacitive electrode 122. However, the present invention is not limited thereto, and in other embodiments, for improving the light transmittance or other considerations, the conductive layer comprising the plurality of third electrodes 202 may not completely cover the work region 110a and the peripheral region 110b; in other embodiments, the plurality of third electrodes 202 also are separate from each other to expose a part of the work region 110a of the substrate 110 (for example, spacings g, depicted in FIG. 2J, between the photo-sensing structures PD and the data lines DL and scan lines SL). The third electrodes 202 may be light-transmissive electrodes. In the present embodiment, a material of the third electrodes 202 may be selected from metal oxides, for example, indium tin oxide, indium zinc oxide, aluminum tin oxide, aluminum zinc oxide, indium germanium zinc oxide, other suitable oxides, or stacked layers of at least two of the above-mentioned materials. However, the present invention is not limited thereto.

Referring to FIG. 1J, in the present embodiment, each of the photo-sensing structures PD may fill a corresponding one of the openings 152, and an edge (i.e., side walls 162a, 172a) of the photo-sensing structure PD may cover a part of the insulation layer 150'. The insulation layer 190' covers the side walls 182a of the second electrodes 182 and the side walls 162a, 172a of the photo-sensing structures PD, and has the openings 192 exposing the second electrodes 182. The third electrodes 202 covers a part of the insulation layer 190' and are disposed in the corresponding openings 192 of the insulation layer 190' to be electrically connected to the corresponding second electrodes 182. It is to be noted that, since the insulation layer 190' covers the side walls 182a of the second electrodes 182 and the side walls 162a, 172a of the photo-sensing structures PD, a current i generated by the photo-sensing structures PD as a result of light is less likely to form leakage routes when transmitted between the conductive layer 200 and the side walls 182a (and/or between the conductive layer 200 and the side walls 162a, 172a of the photo-sensing structures PD). In other words, through the arrangement of the insulation layer 190, the current i is easily transmitted in a central region of the second electrodes 182, the photo-sensing structures PD and the first electrodes 142, thereby improving the signal-to-noise (SNR) of the photo-sensing panel.

Referring to FIG. 1K and FIG. 2K, then, a plurality of shading patterns 210 may be optionally formed on the insulation layer 190'. Each of the shading patterns 210 is overlapped with a corresponding one of the semiconductor patterns ch and exposes a corresponding one of the photo-sensing structures PD. The shading patterns 210 can be used to block light beams from outside to reduce the probability of current leakage due to irradiation of the light beams from outside on the thin film transistors T, thereby improving the performance of the photo-sensing panel PPS. In the present embodiment, a material of the shading patterns 210 is for example a metal material, but the present invention is not limited thereto. Then, a light-transmissive protective layer 220 may be optionally formed on the substrate 110, to protect the members below, for example, the photo-sensing structures PD, the thin film transistors T and others. As such, the photo-sensing panel PPS of the present embodiment is completed.

Referring to FIG. 1K and FIG. 2K, the photo-sensing panel PPS comprises a substrate 110, a plurality of photo-sensing units 100 (as shown in FIG. 2K) arranged on the substrate 110 in an array, a plurality of data lines DL, and a plurality of scan lines SL crossing the data lines DL. The plurality of photo-sensing units 100 are arranged on the substrate 110 in an array. The plurality of data lines DL and the plurality of scan lines SL are electrically coupled to the plurality of photo-sensing units 100. Each of the photo-sensing units 100 comprises at least one first electrode 142, an insulation layer 150, one photo-sensing structure PD, and one second electrode 182. In the present embodiment, each photo-sensing unit 100 may further optionally comprise a third electrode 202, an insulation layer 130', an insulation layer 190', a capacitive electrode 122, and a thin film transistor T. However, the present invention is not limited thereto.

FIG. 3 is a schematic view of a photo-sensing apparatus according to an embodiment of the present invention. The photo-sensing apparatus 1000 of FIG. 3 comprises the photo-sensing panel PPS described above and a light source 300. Referring to FIG. 2K and FIG. 3, the light source 300 is configured to emit a light beam L. The light beam L is emitted from a light-transmissive region 110c between the photo-sensing units 100 and the data lines DL and a light-transmissive region 110c between the photo-sensing units 100 and the scan lines SL. As shown in FIG. 3, in the present embodiment, the light source 300 is for example a backlight module arranged outside the photo-sensing panel PPS. However, the present invention is not limited thereto, and in other embodiments, the light source 300 may also be a plurality of micro-light-emitting elements integrated within the photo-sensing panel PPS, for example, mirco-LEDs or other suitable types of light sources.

Referring to FIG. 3, when an object K (for example, a user's finger) touches the photo-sensing panel PPS, the light beam L is reflected by the object K. The light beam L reflected by a plurality of regions of the object K is delivered to the corresponding plurality of photo-sensing structures PD. The photo-sensing structures PD receive the light beam L reflected by the regions of the object K to generate a corresponding plurality of light currents. The plurality of light currents may be read out via the corresponding plurality of thin film transistors T, such that the state of the object K is detected by the photo-sensing apparatus 1000. In the present embodiment, the light source 300 can emit visible light, infrared light or a combination thereof. For example, when it is desired to detect a surface (for example, a fingerprint) of an object K (for example, a user's finger), the light source 300 can emit visible light; at this time, visible light is reflected by the surface (for example, fingerprint) of the object K, such that an image information of the surface of the object K is obtained by the photo-sensing apparatus 1000. In other words, the photo-sensing apparatus 1000 may be optionally used as a fingerprint scanner. On the other hand, when it is desired to detect an internal tissue (for example, blood vessel) of an object K (for example, a user's finger), the light source 300 can emit infrared light; at this time, infrared light may be transmitted through a surface (for example, skin) of the object K to be reflected by the internal tissue, such that an image information of the internal tissue (for example, blood vessel) of the object K is obtained by the photo-sensing apparatus 1000.

It is to be noted that, in addition to a second photo-sensing material layer 170 (i.e. $Si_vO_w$) capable of absorbing visible light, the photo-sensing structures PD have a first photo-sensing material layer 160 ($Si_xGe_yO_z$) capable of absorbing infrared light, so the photo-sensing panel PPS can detect visible light, infrared light or both. As illustrated in the previous paragraph, since the photo-sensing panel PPS can detect visible light, infrared light or a combination thereof according to the requirement of a user, the photo-sensing panel PPS and the photo-sensing apparatus 1000 have a wide range of applications. More importantly, the second photo-sensing material layer 170 (i.e. $Si_vO_w$) of the photo-sensing structures PD also has the effect of inhibiting leakage current of the first photo-sensing material layer 160 ($Si_xGe_yO_z$). Thus, in addition to a wide range of applications, the photo-sensing panel PPS and the photo-sensing apparatus 1000 using the photo-sensing structures PD further have the advantages of low noise-to-signal ratio and height sensitivity, as shown in FIG. 4.

Figure 4:
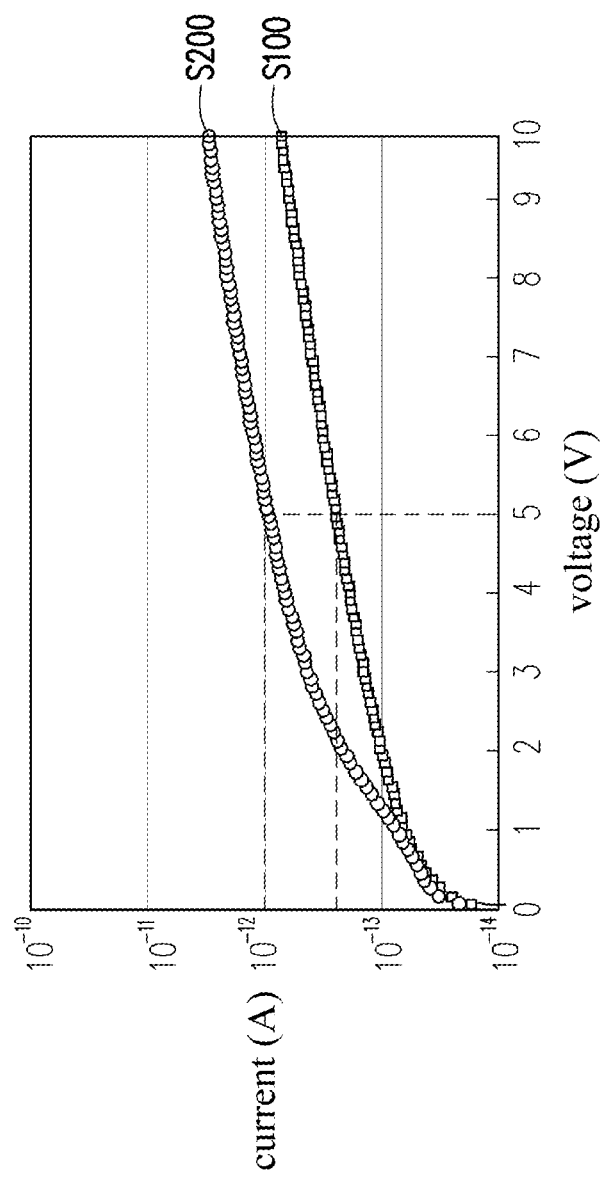
FIG. 4 shows the relationship of voltage and dark current of a photo-sensing structure according to an embodiment of the present invention, and the relationship of voltage and dark current of a photo-sensing structure according to a comparative example.

FIG. 4 shows the relationship of voltage and dark current of a photo-sensing structure PD according to an embodiment of the present invention, and the relationship of voltage and dark current of a photo-sensing structure according to a comparative example. Referring to FIG. 4, the plot S100 represents the relationship of voltage and dark current of the photo-sensing structure PD, and the plot S200 represents the relationship of voltage and dark current of the photo-sensing structure according to the comparative example. The photo-sensing structure PD is formed by stacking $Si_xGe_yO_z$ with $Si_vO_w$. The photo-sensing structure according to the comparative example is formed by stacking $Si_mGe_n$ with $Si_pO_q$, where x=m=4, y=n=1, z=1, v=p, w=q. It can be known by comparing the plots S100 and S200 that, the photo-sensing structure PD of the present embodiment has lower dark current at the same operation voltage (for example, 5 V). In other words, compared with the comparative example, the photo-sensing panel PPS and the photo-sensing apparatus 1000 comprising the photo-sensing structures PD indeed have low noise-to-signal ratio and height sensitivity.

FIG. 5A to FIG. 5H are schematic cross-sectional views of a method for fabricating a photo-sensing panel according to an embodiment of the present invention. FIG. 6A to FIG. 6H are schematic top views of a process flow for fabricating a photo-sensing panel according to an embodiment of the present invention. In particular, FIG. 5A to FIG. 5H correspond to cut lines C-C', D-D' in FIG. 6A to FIG. 6H. The method for fabricating a photo-sensing panel in FIG. 5A to FIG. 5H and FIG. 6A to FIG. 6H is similar to that in FIG. 1A to FIG. 1K and FIG. 2A to FIG. 2K, and thus similar or corresponding elements are indicated by the same or corresponding reference numbers. The main difference between the two is that, the method for fabricating a photo-sensing panel in FIG. 5A to FIG. 5H and FIG. 6A to FIG. 6H lacks the manufacture processes of the insulation layer 190' and the third electrodes 122. This difference is described below, and the similarities between the two are referenced by the above-mentioned description according to the reference numbers in FIGS. 5A to 5H and FIGS. 6A to 6H and are not repeatedly described here.

Referring to FIG. 5A and FIG. 6A, firstly, a substrate 110 is provided. Then, a conductive layer 120 may be formed on the substrate 110. The conductive layer 120 comprises a plurality of gates G, a plurality of scan lines SL (as shown in FIG. 2A) and a plurality of capacitive electrodes 122 in the work region 110a. The gates G are connected to the corresponding scan lines SL. The capacitive electrodes 122 are separated from the gates G and the scan lines SL. In this embodiment, the conductive layer 120 also comprises a plurality of connecting lines 124 (as shown in FIG. 2A) and a bus line 126. Each of the connecting lines 124 connects in series capacitive electrodes 122 in a same row.

Figures 5B, 6B:
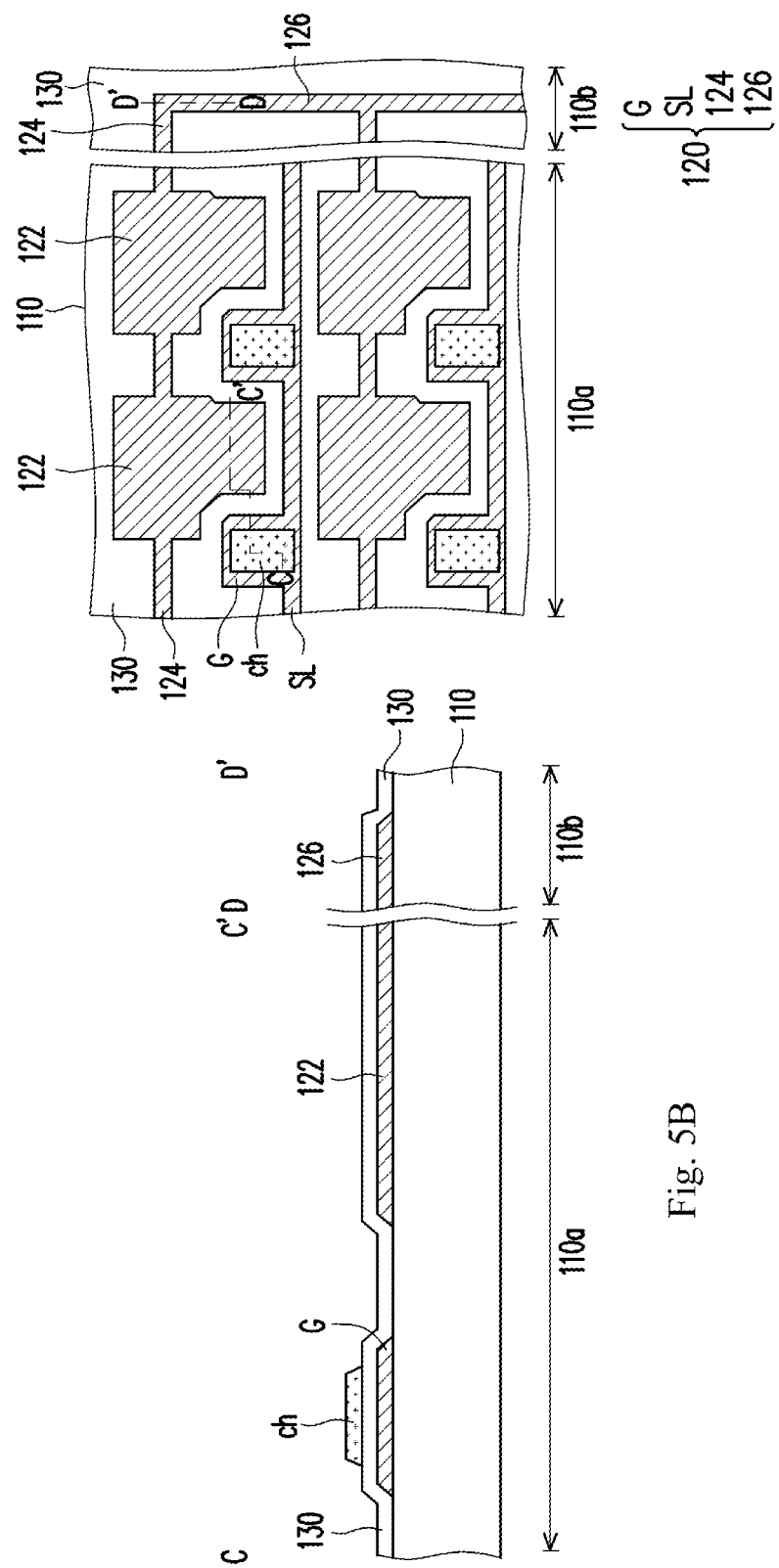

Referring to FIG. 5B and FIG. 6B, then an insulation material layer 130 is formed to cover the conductive layer 120. Then, a semiconductor layer may be formed on the insulation material layer 130. The semiconductor layer comprises a plurality of semiconductor patterns ch separate from each other. Each of the semiconductor patterns ch is overlapped with a corresponding one of the gates G. Referring to FIG. 5C and FIG. 6C, then a conductive layer 140 is formed on the substrate 110. The conductive layer 140 is arranged on the insulation material layer 130. The conductive layer 140 comprises a plurality of data lines DL (as shown in FIG. 2C), a plurality of sources S, a plurality of drains D, and a plurality of first electrodes 142. The scan lines SL are crossed by the data lines DL. The drains D and the sources S are separate from each other. The sources S are connected to the corresponding data lines DL, and each of the sources S and a corresponding one of the drains D are located on two sides of the same one of the semiconductor patterns ch, respectively. A thin film transistor T may be formed by each semiconductor pattern ch and the corresponding source S, drain D and gate G.

Referring to FIG. 5D and FIG. 6D, then an insulation material layer 150 is formed to cover the conductive layer 140. Referring to FIG. 5E and FIG. 6E, then the insulation material layer 150 (as shown in FIG. 5D and FIG. 6D) is patterned with a photo-mask M1 as a mask, to form an insulation layer 150'. The insulation layer 150' has a plurality of openings 152. Each of the openings 152 exposes a corresponding one of the first electrodes 142. In the present embodiment, an opening 154 in the peripheral region 110b is patterned when the plurality of openings 152 in the work region 110a is patterned. Since no conductive layer 140 is provided directly under the opening 154, when the opening 154 is formed, the insulation material layer 130 (as shown in FIG. 1D and FIG. 2D) under the opening 154 is also patterned, thereby forming an insulation layer 130' having an opening 132. The openings 132, 154 extend through the insulation layers 130' and 150' respectively, and are in communication with each other. The openings 132, 154 may be regarded as one through hole and the through hole exposes the bus line 126.

Referring to FIG. 5F and FIG. 6F, then, a photo-sensing layer comprising a first photo-sensing material layer 160 and a second photo-sensing material layer 170 is formed. The photo-sensing layer covers the insulation layer 150 and the first electrodes 142 exposed by the openings 152. In the present embodiment, the second photo-sensing material layer 170 is formed and then the first photo-sensing material layer 160 is formed on the second photo-sensing material layer 170.

Referring to FIG. 5G and FIG. 6G, then, the photo-sensing layer comprising the first photo-sensing material layer 160 and the second photo-sensing material layer 170 is patterned with a second photo-mask M2 as a mask, to form a plurality of photo-sensing structures PD-A. In particular, the first photo-sensing material layer 160 and the second photo-sensing material layer 170 are simultaneously patterned with the photo-mask M2 as a mask, to form a plurality of first photo-sensing layers 162 separate from each other and a plurality of second photo-sensing layers 172 separate from each other. Each of the photo-sensing structures PD-A is located in a corresponding one of the openings 152 and is electrically connected to a corresponding one of the first electrodes 142. Each photo-sensing structure PD-A comprises one of the first photo-sensing layers 162 and one of the second photo-sensing layers 172 stacked directly above the same one of the first electrodes 142. A material of the first photo-sensing layers 162 is $Si_xGe_yO_z$ where none of x, y and z is 0. A material of the second photo-sensing layers 172 is $Si_vO_w$ where neither v nor w is 0.

Again, referring to FIG. 5F, in the present embodiment, the second photo-sensing material layer 170 and then the first photo-sensing material layer 160 are formed. Thus, as shown in FIG. 5G, in the photo-sensing structure PD-A, the first photo-sensing layer 162 formed from the first photo-sensing material layer 160 is located at an upper position and the second photo-sensing layer 172 formed from the second photo-sensing material layer 170 is located at a lower position. In other words, in the present embodiment, the second photo-sensing layers 172 are sandwiched between the first electrodes 142 and the first photo-sensing layers 162.

Figures 5H, 6H:
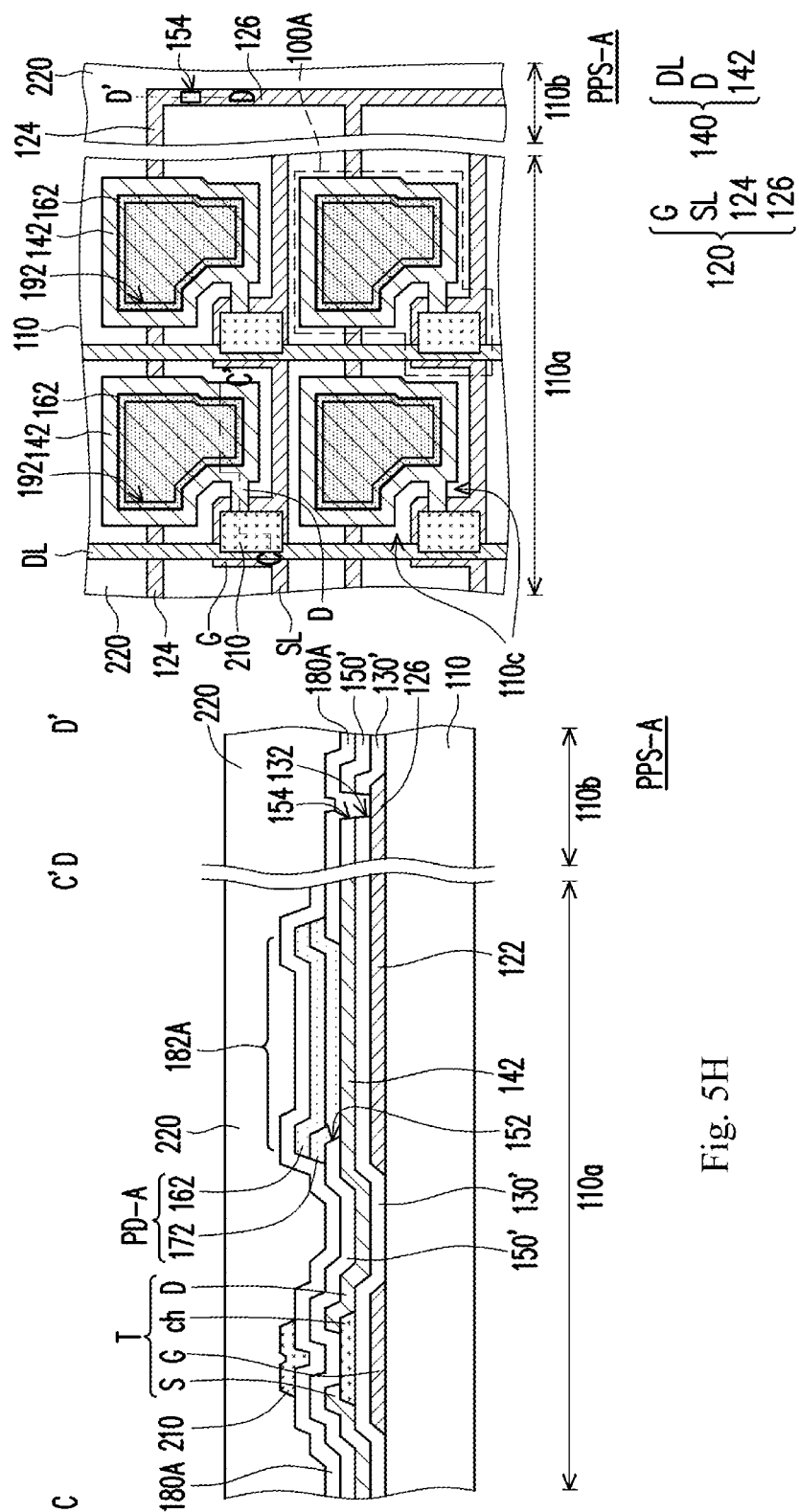

Referring to FIG. 5H and FIG. 6H, then, a plurality of second electrodes 182A are formed to cover the plurality of photo-sensing structures PD-A. The plurality of second electrodes 182A corresponding to the plurality of photo-sensing structures PD-A belong to the same light-transmissive conductive layer 180A. In the present embodiment, the light-transmissive conductive layer 180A may optionally be a whole-face pattern, to comprehensively cover (blanket-cover) the work region 110a and the peripheral region 110b of the substrate 110. A corresponding one of the second electrodes 182A directly above one of the photo-sensing structures PD may be a part of the light-transmissive conductive layer 180A. A part of the light-transmissive conductive layer 180A in the peripheral region 110b is disposed in one through hole defined by the openings 154, 132 to be electrically connected to the bus line 126, such that each second electrode 182A is electrically connected to a corresponding one of the capacitive electrodes 122. However, the present invention is not limited thereto, and in other embodiments, for improving the light transmittance or other considerations, the light-transmissive conductive layer 180A may be not a whole-face pattern completely covering the work region 110a and the peripheral region 110b, and the light-transmissive conductive layer 180A also may be separate from each other to expose a part of the work region 110a of the substrate 110 (for example, the spacing between the photo-sensing structures PD-A and the data lines DL and scan lines SL). In addition, as shown in FIG. 5H, in the present embodiment, the first photo-sensing layer 162 (i.e. $Si_xGe_yO_z$) is located at an upper position and the second photo-sensing layer 172 (i.e. $Si_vO_w$) is located at a lower position, such that the first photo-sensing layer 162 (i.e. $Si_xGe_yO_z$) does not directly contact the first electrode 142, and also the second photo-sensing layer 172 (i.e. $Si_vO_w$) has the effect of inhibiting leakage current (particularly, lateral leakage current) of the first photo-sensing material layer 160 ($Si_xGe_yO_z$). Therefore, the leakage problem of the photo-sensing panel can be solved without arrangement of the insulation layer 190' in FIG. 1K.

Referring to FIG. 5H and FIG. 6H, then, a plurality of shading patterns 210 may be optionally formed on the light-transmissive conductive layer 180A. Each of the shading patterns 210 is overlapped with a corresponding one of the semiconductor patterns ch and exposes a corresponding one of the photo-sensing structures PD-A. Then, a light-transmissive protective layer 220 may be optionally formed on the substrate 110, to cover and protect the members thereunder, for example, the photo-sensing structures PD-A, the thin film transistors T and others. As such, the photo-sensing panel PPS-A of the present invention is completed. The photo-sensing panel PPS-A comprises a substrate 110, a plurality of photo-sensing units 100A (as shown in FIG. 6H) arranged on the substrate 110 in an array, a plurality of data lines DL, and a plurality of scan lines SL crossing the data lines DL. The plurality of photo-sensing units 100A are arranged on the substrate 110 in an array. The plurality of data lines DL and the plurality of scan lines SL are electrically coupled to the plurality of photo-sensing units 100A. Each of the photo-sensing units 100A at least comprises one first electrode 142, an insulation layer 150, one photo-sensing structure PD, and one second electrode 182A.

Figure 7:
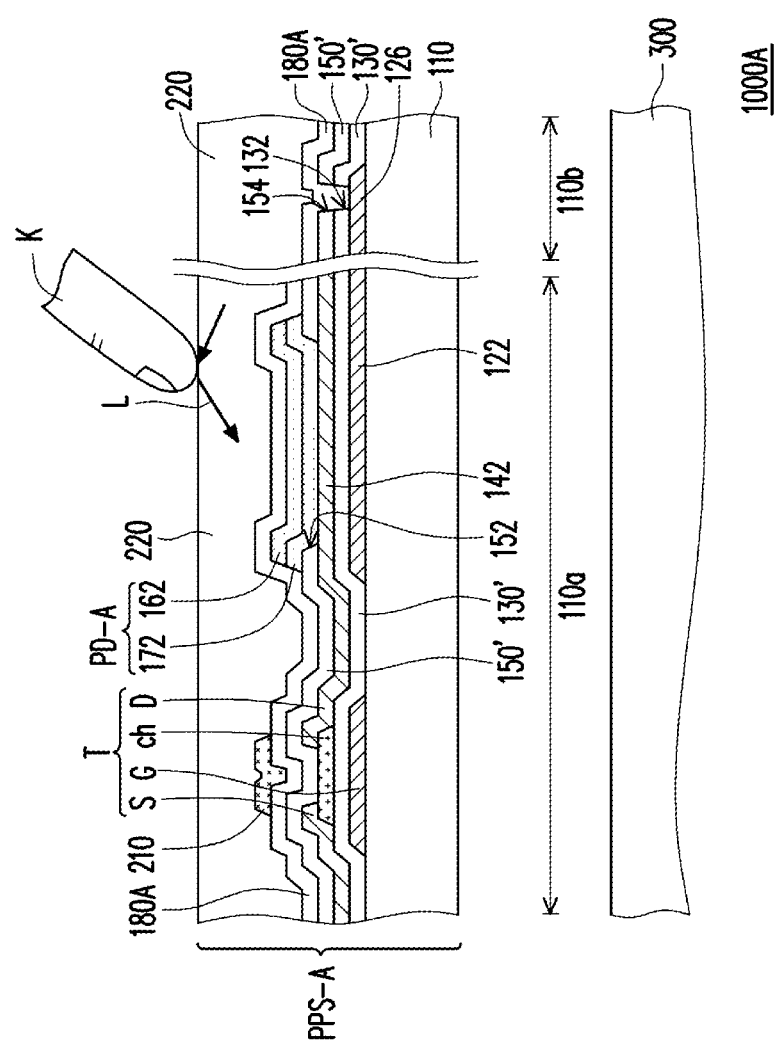
FIG. 7 is a schematic view of a photo-sensing apparatus according to another embodiment of the present invention.

FIG. 7 is a schematic view of a photo-sensing apparatus according to another embodiment of the present invention. The photo-sensing apparatus 1000A in FIG. 7 may be formed by the photo-sensing panel PPS-A in FIGS. 5H and 6H in combination with a light source 300. Referring to FIG. 7 and FIG. 5H, the light source 300 is configured to emit a light beam L. The light beam L is emitted from a light-transmissive region 110c between the photo-sensing units 100 and the data lines DL, and a light-transmissive region 110c between the photo-sensing units 100 and the scan lines SL. The light source 300 can emit visible light, infrared light or a combination thereof. The photo-sensing panel PPS-A in FIGS. 5H and 6H and the photo-sensing apparatus 1000A in FIG. 7 have the efficacy and advantages corresponding to those of the photo-sensing panel PPS in FIG. 1K and FIG. 2K and the photo-sensing apparatus 1000 in FIG. 3, and are not repeatedly described here.

In sum, in addition to a second photo-sensing material layer (i.e., $Si_vO_w$) capable of absorbing visible light, the photo-sensing unit in an embodiment of the present invention further comprises a first photo-sensing material layer ($Si_xGe_yO_z$) capable of absorbing infrared light. Thus, the photo-sensing structure has a wide photo-sensitive spectrum, and can be used to detect visible light, infrared light or both. Accordingly, the photo-sensing apparatus comprising the photo-sensing structure has a wide range of applications. In addition, because the second photo-sensing material layer (i.e., $Si_vO_w$) of the photo-sensing structure is capable of inhibiting leakage current of the first photo-sensing material layer ($Si_xGe_yO_z$), the photo-sensing apparatus comprising the photo-sensing structure has a low noise-to-signal ratio and height sensitivity.

Even though the present invention has been disclosed as the abovementioned embodiments, it is not limited thereto. A person of ordinary skill in the art may make some changes and adjustments without departing from the spirit and scope of the present invention. Therefore, the scope of the present invention is defined in view of the appended claims.

What is claimed is:

1. A photo-sensing unit, comprising:
   a first electrode;
   a first insulation layer above said first electrode and having a first opening to uncover said first electrode;
   a photo-sensing structure located on said first electrode and disposed in the first opening of said first insulation layer, wherein said photo-sensing structure comprises:
   a first photo-sensing layer, comprising $Si_xGe_yO_z$; and
   a second photo-sensing layer, comprising $Si_vO_w$, wherein said second photo-sensing layer is stacked on said first photo-sensing layer; and
   a second electrode covering said photo-sensing structure;
   wherein, x, y, z, v, and w are integers values and non-zero.

2. The photo-sensing unit according to claim 1, wherein said second photo-sensing layer is sandwiched between said first electrode and said first photo-sensing layer.

3. The photo-sensing unit according to claim 1, further comprising:
   a second insulation layer, wherein said photo-sensing structure is disposed in the first opening of the first insulation layer, an edge of said photo-sensing structure covers a part of said first insulation layer, and said second insulation layer covers a side wall of the second electrode and a side wall of the photo-sensing structure, and has a second opening to uncover the second electrode; and a third electrode disposed in the second opening of said second insulation layer to be electrically connected to said second electrode.

4. The photo-sensing unit according to claim 3, wherein said first photo-sensing layer is sandwiched between the first electrode and said second photo-sensing layer.

5. The photo-sensing unit according to claim 3, further comprising:

a capacitive electrode arranged under said photo-sensing structure; and a third insulation layer arranged between said first electrode and said capacitive electrode, wherein said first insulation layer, said second insulation layer and said third insulation layer have a through hole, and said third electrode is electrically connected to said capacitive electrode through said through hole.

6. The photo-sensing unit according to claim 1, further comprising:

a thin film transistor having a gate, a semiconductor layer overlapped with the gate, and a source and a drain on two sides on said semiconductor layer respectively, wherein the drain of the thin film transistor is electrically connected to said first electrode; and a capacitive electrode shielding said photo-sensing structure, said first electrode being located between said photo-sensing structure and said capacitive electrode, wherein said capacitive electrode is electrically connected to said second electrode.

7. The photo-sensing unit according to claim 1, wherein $$0.5 < \frac{x}{y} < 10.$$

8. The photo-sensing unit according to claim 1, wherein $$1 \leq \frac{(x+y)}{z} \leq 10.$$

9. A photo-sensing apparatus, comprising:
a first photo-sensing unit and a second photo-sensing unit arranged in an array, wherein said first photo-sensing unit and said second photo-sensing unit each comprise:
a first electrode;
a first insulation layer above said first electrode and having a first opening to uncover said first electrode;
a photo-sensing structure located on said first electrode and disposed in the first opening of said first insulation layer, wherein said photo-sensing structure comprises:
a first photo-sensing layer, comprising $Si_xGe_yO_z$; and
a second photo-sensing layer, comprising $Si_vO_w$, wherein said second photo-sensing layer is stacked on said first photo-sensing layer;
a second electrode covering said photo-sensing structure;
a plurality of data lines electrically coupled to said first photo-sensing unit and said second photo-sensing unit;
a first scan line intersected by said data lines; and
a light source configured to emit a light beam, the light beam being emitted from a light-transmissive region between said first photo-sensing unit, said second photo-sensing unit, said data lines, and said scan line;
wherein, x, y, z, v, and w are integers values and non-zero.

10. The photo-sensing apparatus according to claim 9, wherein said light beam is visible light, infrared light or a combination thereof.

11. A method for fabricating a photo-sensing unit, comprising:
providing a substrate;
forming a first conductive layer on said substrate, said first conductive layer comprising a first electrode;
forming a first insulation material layer to cover said first conductive layer;
patterning said first insulation material layer with a first photo-mask to form a first insulation layer having a first opening, wherein the first opening exposes the first electrode of the first conductive layer;
forming a photo-sensing layer to cover said first insulation layer and the first electrode exposed by said first opening;
patterning said photo-sensing layer with a second photo-mask to form a photo-sensing structure, wherein said photo-sensing structure is disposed in said first opening of said first insulation layer and is electrically connected to said first electrode, said photo-sensing structure comprises a first photo-sensing layer and a second photo-sensing layer stacked on the first photo-sensing layer, a material of said first photo-sensing layer is $Si_xGe_yO_z$, and a material of said second photo-sensing layer is $Si_vO_w$; and
forming a second electrode to cover said photo-sensing structure;
wherein x, y, z, v, and w are integers and non-zero.

12. The method for fabricating the photo-sensing unit according to claim 11, wherein the steps of forming the photo-sensing structure and the second electrode comprise:
forming said photo-sensing layer and a light-transmissive conductive layer disposed on said photo-sensing layer; and
simultaneously patterning the photo-sensing layer and the light-transmissive conductive layer with said second photo-mask, to form said photo-sensing structure and said second electrode.

13. The method for fabricating the photo-sensing unit according to claim 11, further comprising:
forming a second insulation material layer to cover said second electrode;
patterning said second insulation material layer with said first photo-mask, to form a second insulation layer on said second electrode, wherein said second insulation layer has a second opening to expose said second electrode; and
forming a third electrode on said second electrode, wherein said third electrode is disposed in said second opening to be electrically connected to said second electrode.

14. The method for fabricating the photo-sensing unit according to claim 13, further comprising:
before forming said first conductive layer, forming a second conductive layer on said substrate, said second conductive layer comprising a gate and a capacitive electrode separate from said gate, wherein said capacitive electrode is located under said photo-sensing structure;
forming a third insulation material layer to cover said second conductive layer; and forming a semiconductor layer on said third insulation material layer, said semiconductor layer being overlapped with said gate, wherein said first conductive layer further comprises a source and a drain, said source and said drain are located on a first side and a second side of the semiconductor layer respectively, and said drain is connected to said first electrode.

15. The method for fabricating the photo-sensing unit according to claim 14, wherein said second conductive layer further comprises forming a bus line electrically connected to said capacitive electrode, and said step of patterning said first insulation material layer with said first photo-mask to form said first insulation layer further comprises:

simultaneously patterning said third insulation material layer, to form a third insulation layer and form a third opening passing through said first insulation layer and the third insulation layer, the third opening exposing said bus line.

16. The method for fabricating the photo-sensing unit according to claim 15, wherein the step of patterning said second insulation material layer with said first photo-mask further comprises:

forming a fourth opening in the second insulation layer, said third opening being in communication with said fourth opening, and said third electrode being electrically connected to said bus line through said third opening and said fourth opening.

* * * * *